United States Patent
Nan

(10) Patent No.: US 10,985,187 B1
(45) Date of Patent: Apr. 20, 2021

(54) DISPLAY PANEL AND FABRICATION METHOD, AND DISPLAY DEVICE

(71) Applicant: Shanghai Tianma Micro-Electronics Co., Ltd., Shanghai (CN)

(72) Inventor: Yang Nan, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/848,531

(22) Filed: Apr. 14, 2020

(30) Foreign Application Priority Data

Dec. 31, 2019 (CN) .......................... 201911421064.8

(51) Int. Cl.
| H01L 27/12 | (2006.01) |
| H01L 25/075 | (2006.01) |
| H01L 33/62 | (2010.01) |
| H01L 29/786 | (2006.01) |
| H01L 29/423 | (2006.01) |

(52) U.S. Cl.
CPC ...... *H01L 27/1222* (2013.01); *H01L 25/0753* (2013.01); *H01L 27/1259* (2013.01); *H01L 29/42384* (2013.01); *H01L 29/78696* (2013.01); *H01L 33/62* (2013.01); *H01L 2933/0066* (2013.01)

(58) Field of Classification Search
CPC ............. H01L 27/1222; H01L 27/1259; H01L 29/42384; H01L 33/62; H01L 29/78696; H01L 25/0753; H01L 2933/0066
See application file for complete search history.

(56) References Cited

U.S. PATENT DOCUMENTS

| 5,414,283 A * | 5/1995 | den Boer | G02F 1/1368 |
| | | | 257/59 |
| 9,711,580 B2 * | 7/2017 | Zhang | H01L 27/3262 |
| 10,658,392 B1 * | 5/2020 | Chen | H01L 29/41733 |
| 2013/0134422 A1 * | 5/2013 | Tsubuku | H01L 29/42384 |
| | | | 257/57 |
| 2017/0092778 A1 * | 3/2017 | Zhang | H01L 29/78696 |
| 2019/0131461 A1 * | 5/2019 | Chen | H01L 27/1251 |
| 2019/0378931 A1 * | 12/2019 | Tian | H01L 29/78633 |
| 2020/0035835 A1 * | 1/2020 | Zhou | H01L 29/7869 |
| 2020/0243660 A1 * | 7/2020 | Luan | H01L 21/0274 |

FOREIGN PATENT DOCUMENTS

| CN | 107170773 A | 9/2017 |
| CN | 108598175 A | 9/2018 |

* cited by examiner

*Primary Examiner* — Victor A Mandala
(74) *Attorney, Agent, or Firm* — Anova Law Group PLLC

(57) ABSTRACT

A display panel and fabrication method, and a display device are provided. The display panel includes a substrate, an array layer disposed on the substrate, and a light-emitting device disposed on a side of the array layer facing away from the substrate. The array layer includes a thin film transistor, and the thin film transistor includes a ring-shaped active layer, a ring-shaped gate electrode isolatedly overlapped with a channel region of the ring-shaped active layer, and a ring-shaped first end corresponding to and connected to the ring-shaped active layer. The ring-shaped first end is one of a source electrode and a drain electrode of the thin film transistor. The light-emitting device includes a first electrode, and the first electrode is connected to the ring-shaped first end, and the first electrode is a ring-shaped electrode.

20 Claims, 13 Drawing Sheets

DISPLAY PANEL AND FABRICATION METHOD, AND DISPLAY DEVICE

CROSS-REFERENCES TO RELATED APPLICATIONS

This application claims the priority of Chinese patent application No. 201911421064.8, filed on Dec. 31, 2019, the entirety of which is incorporated herein by reference.

FIELD

The present disclosure generally relates to the field of display technology and, more particularly, relates to a display panel and fabrication method, and a display device.

BACKGROUND

Flat display device is featured with advantages such as high picture quality, power saving, thin body and wide application range, etc., has been widely used in a mobile phone, a television, a personal digital assistant, a digital camera, a notebook computer, a desktop computer, and any other consumer electronics, and has become the mainstream in display devices.

Micro light-emitting diode (LED) display is a display that achieves image display using high-density micro-sized LED arrays integrated on a substrate as display pixels. Similar to a large-sized outdoor LED display, each pixel of the micro LED display can be addressed and driven to be lit individually. The micro LED display can be regarded as a reduced version of the outdoor LED display, and distance between pixels may be reduced from millimeters to micrometers. Similar to an organic light-emitting diode (OLED) display, the micro LED display is one of self-illuminated displays, However, compared with the OLED display, the micro LED display is featured with advantages such as excellent material stability, long service life, and no image sticking, and is considered to be the biggest competitor of the OLED displays. The disclosed display panel and fabrication method, and display device are directed to solve one or more problems set forth above and other problems.

SUMMARY

One aspect of the present disclosure provides a display panel. The display panel includes a substrate, an array layer disposed on the substrate, and a light-emitting device disposed on a side of the array layer facing away from the substrate. The array layer includes a thin film transistor, and the thin film transistor includes a ring-shaped active layer, a ring-shaped gate electrode isolatedly overlapped with a channel region of the ring-shaped active layer, and a ring-shaped first end corresponding to and connected to the ring-shaped active layer. The ring-shaped first end is one of a source electrode and a drain electrode of the thin film transistor. The light-emitting device includes a first electrode, and the first electrode is connected to the ring-shaped first end, and the first electrode is a ring-shaped electrode.

Another aspect of the present disclosure provides a fabrication method of a display panel. The method includes providing a substrate; and forming an array layer on the substrate. The fabrication of the array layer includes forming a thin film transistor. The thin film transistor includes a ring-shaped active layer, a ring-shaped gate electrode isolatedly overlapped with a channel region of ring-shaped the active layer, and a ring-shaped first end corresponding to and connected to the ring-shaped active layer. The ring-shaped first end is one of a source electrode and a drain electrode of the thin film transistor. The method also includes providing a light-emitting device including a ring-shaped first electrode. Further, the method includes disposing the light-emitting device on a side of the array layer facing away from the substrate, and connecting the ring-shaped first electrode of the light-emitting device and the ring-shaped first end of the thin film transistor.

Another aspect of the present disclosure provides a display device. The display device includes a display panel. The display panel includes a substrate, an array layer disposed on the substrate, and a light-emitting device disposed on a side of the array layer facing away from the substrate. The array layer includes a thin film transistor, and the thin film transistor includes a ring-shaped active layer, a ring-shaped gate electrode isolatedly overlapped with a channel region of the ring-shaped active layer, and a ring-shaped first end corresponding to and connected to the ring-shaped active layer. The ring-shaped first end is one of a source electrode and a drain electrode of the thin film transistor. The light-emitting device includes a first electrode, and the first electrode is connected to the ring-shaped first end, and the first electrode is a ring-shaped electrode.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Figure 1:
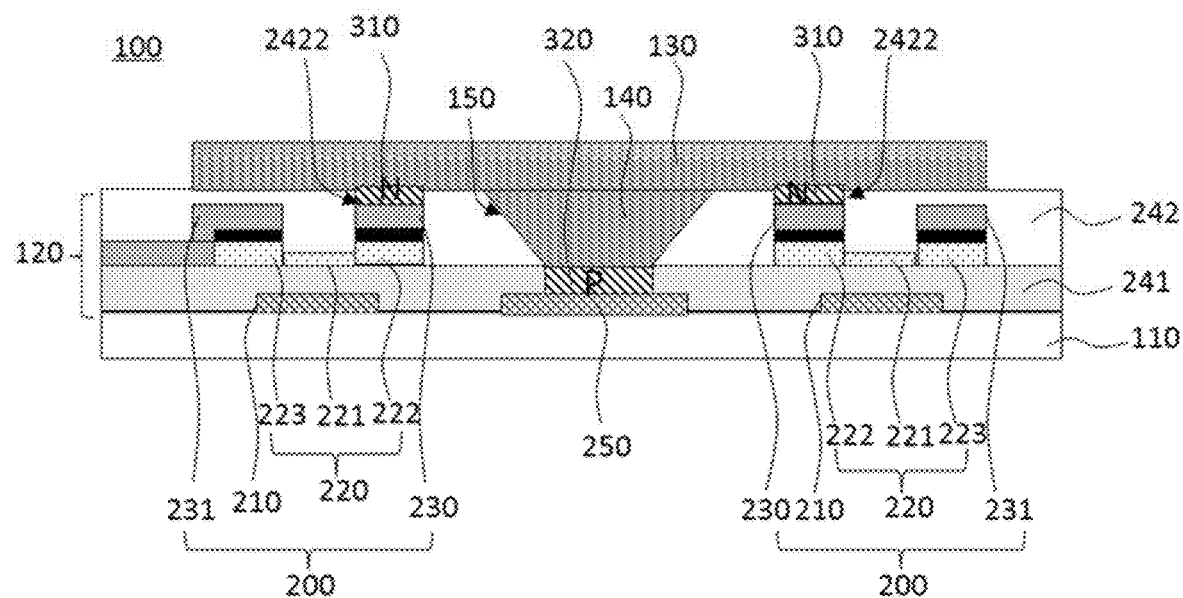
FIG. 1 illustrates a schematic cross-sectional view of an exemplary display panel consistent with disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

The terms used in the disclosed embodiments of the present disclosure are merely for the purpose of describing specific embodiments and are not intended to limit the present disclosure. The singular forms "a," "the," and "such" used in the embodiments and the appended claims of the present disclosure are also intended to include the plural forms unless otherwise clearly indicated by context.

It should be noted that the directional words such as "up", "down", "left", and "right" described in the embodiments of the present disclosure are described at an angle illustrated in the drawing, and should not be considered to limit the disclosed embodiments of the present disclosure. In addition, it is also necessary to understand that in the context, when an element is referred to as being formed "over" or "under" another element, the element can not only be directly formed "on" or "under" the another element, but also can be indirectly formed "over" or "under" the another element through an intermediate element.

Further, the exemplary embodiment can be implemented in various forms, which should not be limited to the embodiments set forth herein. In contrast, the provided embodiments can make the present disclosure substantially comprehensive and complete, and can convey the concepts of the exemplary embodiments to those skilled in the art comprehensively. Similar reference numbers and letters represent similar terms in the following Figures, such that once an item is defined in one Figure, it does not need to be further discussed in subsequent Figures. The words representing the position and direction described in the present disclosure are described by taking the drawing as an example, while changes can also be made as needed, and the changes are within the scope of the present disclosure. The drawings of the present disclosure are merely used to illustrate the relative positional relationship. The layer thicknesses of some parts are exaggerated for easy understanding. The layer thickness in the drawing does not represent the proportional relationship of the actual layer thickness. Further, in the case of no conflict, the disclosed embodiments of the present disclosure and the features in the disclosed embodiments can be combined with each other. The drawings in the disclosed embodiments in the present disclosure use the same reference numerals. In addition, the same or similar features in various embodiments are not repeated herein.

FIG. 1 illustrates a schematic cross-sectional view of a display panel consistent with disclosed embodiments of the present disclosure. Referring to FIG. 1, the cross-section may be perpendicular to a plane where the display panel is located. The display panel 100 may include a substrate 110, an array layer 120, and a light-emitting device 130 that are sequentially disposed.

In one embodiment, the substrate 110 may be made of glass, polyimide (PI), polycarbonate (PC), polyethersulfone (PES), polyethylene terephthalate (PET), polyethylene naphthalate (PEN), polyarylate (PAR), glass fiber-reinforced plastics (FRP), or any other polymer material. The substrate 110 may be transparent, translucent, or opaque.

The array layer 120 may be disposed over the substrate 110. Optionally, the array layer 120 may include a pixel circuit and a driving circuit for controlling the light-emitting device.

In one embodiment, the array layer 120 may further include a thin film transistor 200. Optionally, the thin film transistor 200 may constitute a part of the pixel circuit, and may be a component in the pixel circuit. The thin film transistor 200 may include a gate electrode 210, an active layer 220, and source and drain electrodes.

Figure 4:
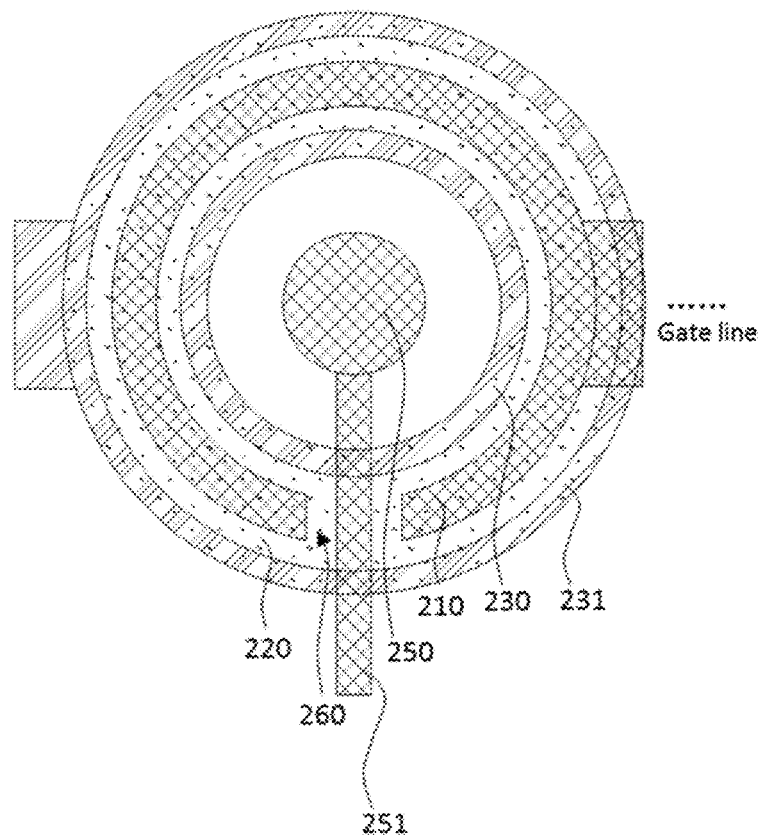
FIG. 4 illustrates a schematic local top view of an exemplary display panel consistent with disclosed embodiments of the present disclosure.
Figure 5:
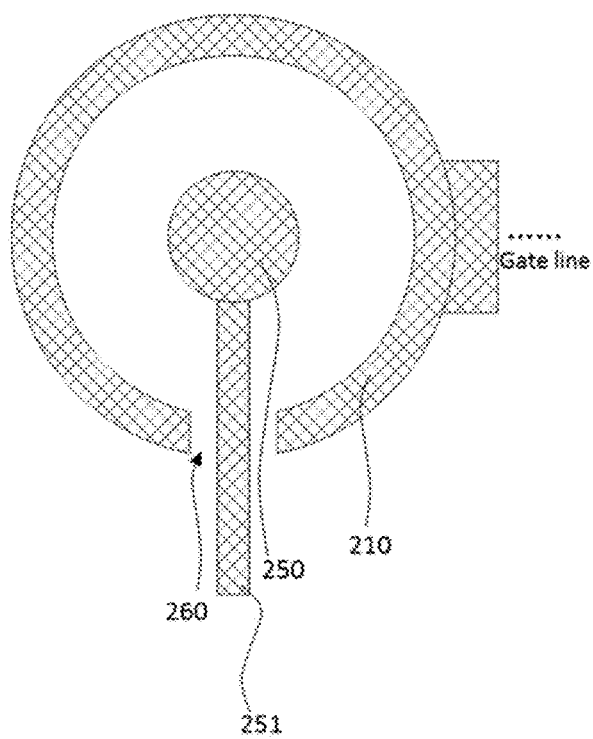
FIGS. 5-7 illustrate exploded schematic diagrams of a structure in FIG. 4 consistent with disclosed embodiments of the present disclosure.
Figure 6:
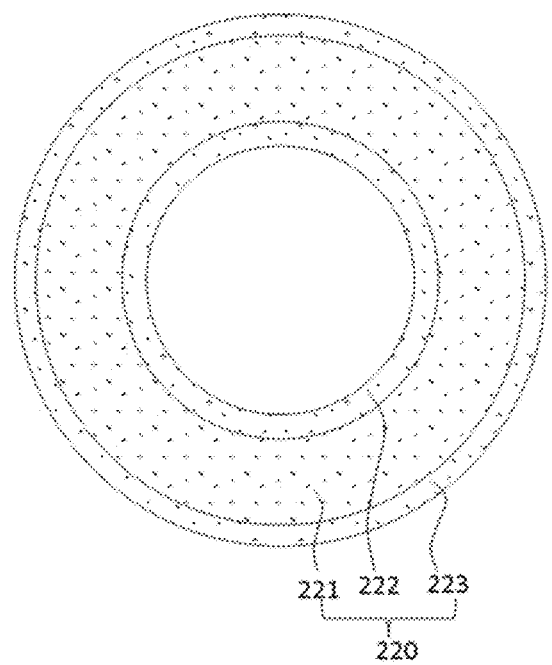
Figure 7:
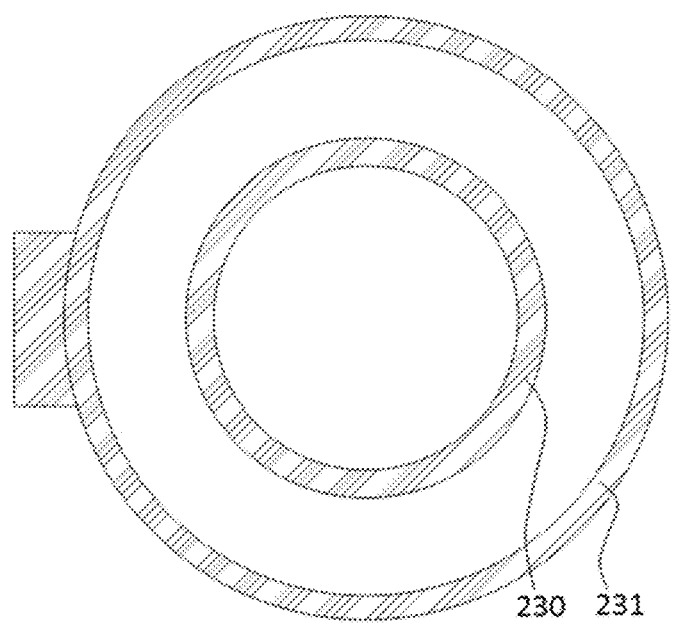

FIG. 4 illustrates a schematic local top view of a display panel consistent with disclosed embodiments of the present disclosure, and FIGS. 5-7 illustrate exploded schematic diagrams of the structure in FIG. 4. Specifically, FIG. 5 illustrates a local schematic diagram of a film layer where a gate electrode is located; FIG. 6 illustrates a local schematic diagram of a film layer where an active layer is located; and FIG. 7 illustrates a local schematic diagram of a film layer where a first end is located (e.g., a film layer where the source and drain electrodes of the thin film transistor (TFT) are located). For illustrative purposes, the disclosed embodiments of the present disclosure may be described by taking a bottom-gate thin film transistor as an example.

In one embodiment, referring to FIG. 1 and FIGS. 4-7, the thin film transistor 200 may include a gate electrode 210 disposed over the substrate 110, and the gate electrode 210 may have a ring shape.

In one embodiment, the gate electrode 210 may have a single-layer or multi-layer structure including gold (Au), silver (Ag), copper (Cu), nickel (Ni), platinum (Pt), palladium (Pd), aluminum (Al), molybdenum (MO), or chromium (Cr), or may be alloys, e.g., aluminum (Al): neodymium (Nd) alloy, and molybdenum (Mo): tungsten (W) alloy.

The thin film transistor 200 may also include the active layer 220 disposed over the gate electrode 210, and the active layer 220 may have a ring shape. In one embodiment, the active layer 220 may be made of a material including amorphous silicon, polysilicon, or metal oxide material, etc.

The active layer may include a channel region 221, and the channel region 221 may have a ring shape. In other words, the active layer 220 may be extended along a ring path, and the channel region 221 may form the ring shape along the extended path of the active layer 220.

The channel region 221 may be an overlapped region between the gate electrode 210 and the active layer 220. In one embodiment, a ring-shaped orthographic projection of the channel region 221 on the substrate 110 may be located within a ring-shaped orthographic projection of the gate electrode 210 on the substrate 110. In other words, the orthographic projection of the gate electrode 210 on the substrate 110 may be extended along a ring path, and the projection of the channel region 221 may form the ring shape along the path of the projection of the gate electrode 210. The ring centers of the two ring-shaped projections may coincide with each other.

Optionally, a first insulating layer 241 may be disposed between the gate electrode 210 and the active layer 220 to separate thereof, such that the gate electrode 210 may be insulated from and overlapped with the active layer 220. In one embodiment, the first insulating layer 241 may be an inorganic layer including silicon oxide, silicon nitride, etc., and may have a single-layer or multi-layer structure. In another embodiment, the first insulating layer 241 may be equivalent to a gate-insulating layer, and may have a single-layer or multi-layer structure.

The thin film transistor 200 may also include a first end 230 disposed over the active layer 220. The first end 230 may be one of the source and drain electrodes of the thin film transistor. The first end 230 may have a ring shape, and may be connected to the corresponding active layer 220. In one embodiment, the first end 230 may be made of a metal material.

In one embodiment, the array layer 120 may further include a second insulating layer 242 covering the thin film transistor 200. The second insulating layer 242 may be a planarization layer, and may include an organic layer, e.g., acrylic, polyimide (PI), or benzocyclobutene (BCB), etc.

In another embodiment, the second insulating layer 242 may be a passivation layer, and may be made of an inorganic layer, e.g., silicon oxide or silicon nitride, etc., or an organic layer.

In one embodiment, the second insulating layer 242 may have an opening 2422 exposing the first end 230. The opening 2422 may have a corresponding shape and size as the first end 230. In other words, the opening 2422 may also have a ring shape, and may coincide with the first end 230.

The light-emitting device 130 may be disposed on a side of the array layer 120 facing away from the substrate 110. In one embodiment, the light-emitting device 130 may be a micro light-emitting diode (micro-LED), or a min-LED.

The light-emitting device 130 may include a first electrode 310. The first electrode 310 may be one of an anode (or N-electrode, positive electrode) and a cathode (or P-electrode, negative electrode) of the light-emitting device 130. For illustrative purposes, the present disclosure may be described using the first electrode 310 being an N-electrode as an example. Further, the first electrode 310 may correspond and be connected to the first end 230 through the opening 2422 of the second insulating layer 242.

Figure 2:
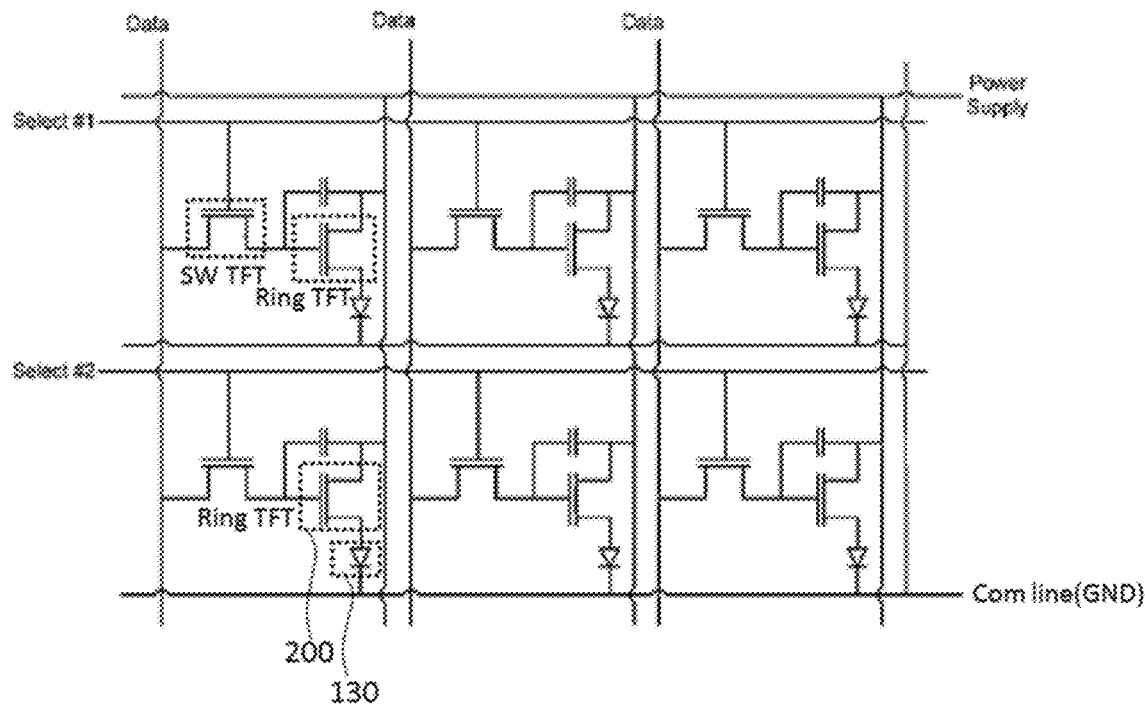
FIG. 2 illustrates a schematic circuit diagram of an exemplary display panel consistent with disclosed embodiments of the present disclosure.

FIG. 2 illustrates a schematic circuit diagram of a display panel consistent with disclosed embodiments of the present disclosure. In one embodiment, for illustrative purposes, a 2T1C (two transistors and one capacitor) driving method may be used as an example. Referring to FIG. 1 and FIG. 2, the thin film transistor 200 (ring TFT) may be used as a driving transistor, a source electrode may be connected to an anode of the light-emitting device 130 made from LED, and a drain electrode may be connected to a power voltage device (PVDD). For a switch thin film transistor (SW TFT), a gate electrode may be connected to a scan line, a Drain may be connected to a Data line, and a Source may be connected to a gate electrode of the ring TFT. A cathode of the LED may be connected to a common electrode (also referred to as a common cathode). Data lines and scan lines that cross each other may define a plurality of pixel circuits, and one pixel circuit may include one thin film transistor 200.

In other words, one light-emitting device 130 may form a minimum light-emitting unit, and each light-emitting unit may emit light of a different color according to a different LED. One light-emitting unit (light-emitting device 130) and one pixel circuit (thin-film transistor 200) may jointly form a pixel, and a plurality of pixels may display a screen image together.

In one embodiment, the first electrode 310 overall may be a ring-shaped electrode. Optionally, the first electrode may be made of a metal material. The shape (referring to a shape of the orthographic projection on the substrate) and the size of the first electrode connected to the corresponding thin film transistor may be consistent with the shape (referring to a shape of the orthographic projection on the substrate) and the size of the first end of the thin film transistor.

In one embodiment, a diameter of the first electrode 310 of the light-emitting device 130 may be consistent with a diameter of the first end 230 of the corresponding thin film transistor 200. For example, when both the first electrode and the first end are rings, the rings may be identical and the centers thereof may coincide with each other, such that the orthographic projections of the first electrode and the first end on the substrate may be overlapped. Even if the first end and the first electrode are not fully equal or overlapped, the first end and the first electrode may still satisfy that the orthographic projection of one of the first end and the first electrode on the substrate may be extended along the path of the orthographic projection of the other one of the first end and the first electrode on the substrate.

Optionally, the display panel 100 may further include a buffer layer (not illustrated in the Figure), and the buffer layer may be disposed between the array layer 120 and the substrate 110. The buffer layer may have a laminated structure including a plurality of inorganic and organic layers, to block oxygen and moisture, to prevent moisture or impurities from diffusing through the substrate, and to provide a flat surface over an upper surface of the substrate. The specific structure thereof may not be repeated in the present disclosure.

Optionally, the display panel 100 may further include a protection layer (not illustrated) covering the light-emitting device 130, to protect the light-emitting device from being eroded by water and oxygen.

Optionally, the display panel 100 may be divided into a display region and a non-display region disposed around the display region. It can be understood that the display region may be a region of the display panel for displaying screen, and may often include a plurality of pixels arranged in an array. One pixel may include the corresponding light-emitting device 130 and thin film transistor 200. The non-display region may surround the display region, and may often include a peripheral driving element, a peripheral wiring, and a fan-out region.

In the disclosed embodiments of the present disclosure, the light-emitting device may have a shape consistent with the thin film transistor, and the light-emitting device may be overlapped with the thin film transistor, which may reduce the space occupied by a pixel composed of correspondingly connected light-emitting device and thin film transistor. A substantially large amount of pixels may be disposed on the display panel having a same area, thereby improving the screen resolution.

In addition, the thin film transistor and the light-emitting device may have a nested relationship in structure, which may reduce a thickness of the display panel and may achieve a thin and light display panel.

On the one hand, the light-emitting device may be directly connected to the thin-film transistor. Because the light-emitting device has the first electrode, the thin-film transistor may have the first end for normal operation. Therefore, the direct connection between the first electrode of the light-emitting device and the first end of the thin-film transistor may allow the connection between the light-emitting device and the thin-film transistor with reduced thickness of the display panel.

On the other hand, in the disclosed embodiments, the first electrode may need to be directly connected to the first end, and any other structure may not need to be disposed between the first electrode and the first end. To expose the first end of the thin film transistor, a thickness of an insulating layer (e.g., the second insulating layer 242) covering the first end of the thin film transistor may be reduced. In addition, any other structure may not need to be disposed between the first electrode and the first end, which may facilitate reducing the thickness of the display panel. In other words, any other structure may not need to be disposed between the first electrode and the first end, the first electrode of the light-emitting device may be connected to an inner ring of the thin film transistor, and the first electrode of the light-emitting device may not be overlapped with the channel region of the active layer as well as the second end of the thin film transistor, such that the thickness of the insulating layer covering the first end may be reduced without causing a short circuit or crosstalk between other components.

Moreover, in the disclosed display panel, a flat assembly (because the first electrode of the light-emitting device has a corresponding first end to provide a carrying surface) of the light-emitting device may be ensured without forming a substantially thick planarization layer on the thin film transistor, which may reduce the loading of the display panel.

In addition, in the disclosed embodiments, the ring-shaped thin film transistor may be disposed, and the first electrode overall may be a ring-shaped electrode, which may facilitate the overlapped arrangement of the light-emitting device and the thin film transistor. Because the ring-shaped first electrode and first end may form contact points at multiple angles with respect to the ring center on the plane where the contact surface between the thin film transistor and the light-emitting device is located (the plane parallel to the substrate). In view of this, when being aligned with the first end, even if the light-emitting device rotates on the contact surface with respect to the center, the connection between the thin film transistor and the light-emitting device may not be affected. In the disclosed embodiments, the ring center of the first electrode may coincide with the geometric center of the light-emitting device. In other words, the light-emitting device may have a cylindrical shape, the first electrode may be located at one end of the pillar, and the central axis of the pillar may coincide with the ring center of the first electrode.

Further, in the above-disclosed embodiments, the manufacturing process may be simplified, and the thickness of the display panel may be reduced.

Figure 3:
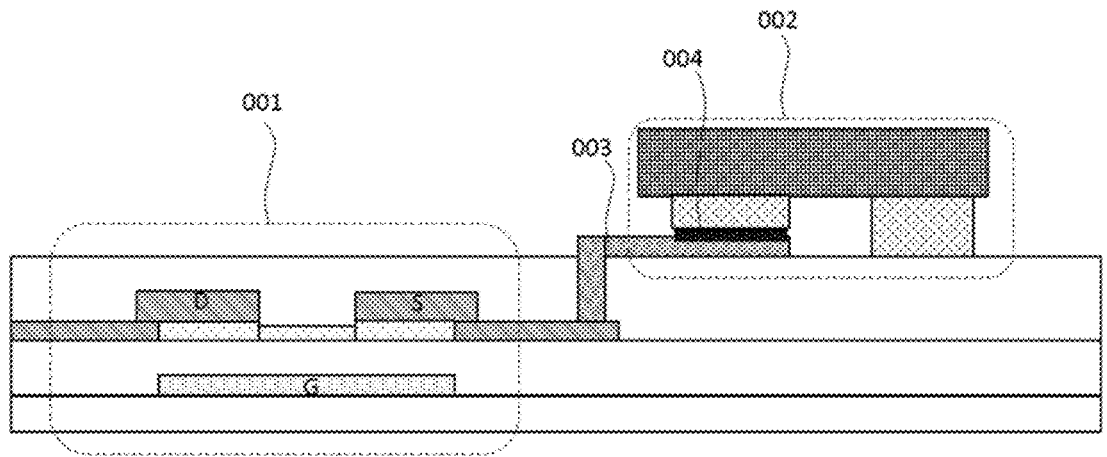
FIG. 3 illustrates a schematic diagram of an existing display panel.

FIG. 3 illustrates a schematic diagram of an existing display panel. Referring to FIG. 3, in the existing display panel, because a thin film transistor (TFT) 001 has a shape inconsistent with a light-emitting device (LED) 002, they cannot be accurately aligned. Alignment accuracy merely depends on the accuracy of the transfer device, and the transferred LED cannot be well overlapped with the TFT. Therefore, to electrically connect TFT and LED, the electrode of LED needs to be electrically connected to the TFT through an indium tin oxide (ITO) wiring 332. While the contact performance between ITO and the LED is poor, a metal layer 004 needs to be added between the ITO and the electrode of the LED. In view of this, not only the manufacturing process increases, but also the thickness of the display panel increases.

In the disclosed display panel, the light-emitting device may be overlapped and in direct contact with the thin film transistor, which may not only reduce the steps of additionally providing the ITO and the metal layer, simplify the manufacturing process, reduce the thickness of the display panel, but also reduce the loss of signal transmitted between the thin film transistor and the light-emitting device.

It can be understood that in the present disclosure, the "ring (shape)" may include a closed ring (shape) and a non-closed ring (shape). The non-closed ring may have at least one notch, and the notch may connect the inner region of the ring and the outer region of the ring.

It can be understood that the above-mentioned ring shape of a certain structure may refer to a shape of the orthographic projection of the certain structure on the plane where the display panel is located.

It can be understood that the two sides of the ring shape may refer to the inside of the ring and the outside of the ring. In other words, the ring shape may include two contours (or edges for forming the pattern), and the outside edge may surround the inside edge. The inside of the ring may refer to a side adjacent to the inside edge of the ring, and the outside of the ring may refer to a side adjacent to the outside edge of the ring.

It can be understood that in the present disclosure, a certain film layer being disposed "on" another film layer may be understood as being disposed "on a side facing away from the substrate". Whether the two film layers are in contact may refer to the definition of the specific positional relationship between the two film layers in the present disclosure.

It can be understood that in the present disclosure, the "corresponding" in the "corresponding" disposure of the two ring structures may refer to that the two rings are disposed with a same point as the ring center, thereby forming a nested or overlapped structure. For example, "correspond and be connected to" in the above-mentioned "the first electrode 310 may correspond and be connected to the first end 230" may refer to that the projection the ring-shaped first electrode overlaps with the projection of the ring-shaped first end, or the geometric centers of the two rings overlap. For example, when the first electrode and the first end have a ring shape, they may be identical and the rings thereof may overlap, and, thus, the orthographic projections thereof on the substrate may well overlap. Even if the first end and the first electrode are not fully equal or do not coincide, they may still satisfy that the orthographic projection of one of the first end and the first electrode on the substrate may extend along the path of the orthographic projection of the other one of the first end and the first electrode.

Figure 9:
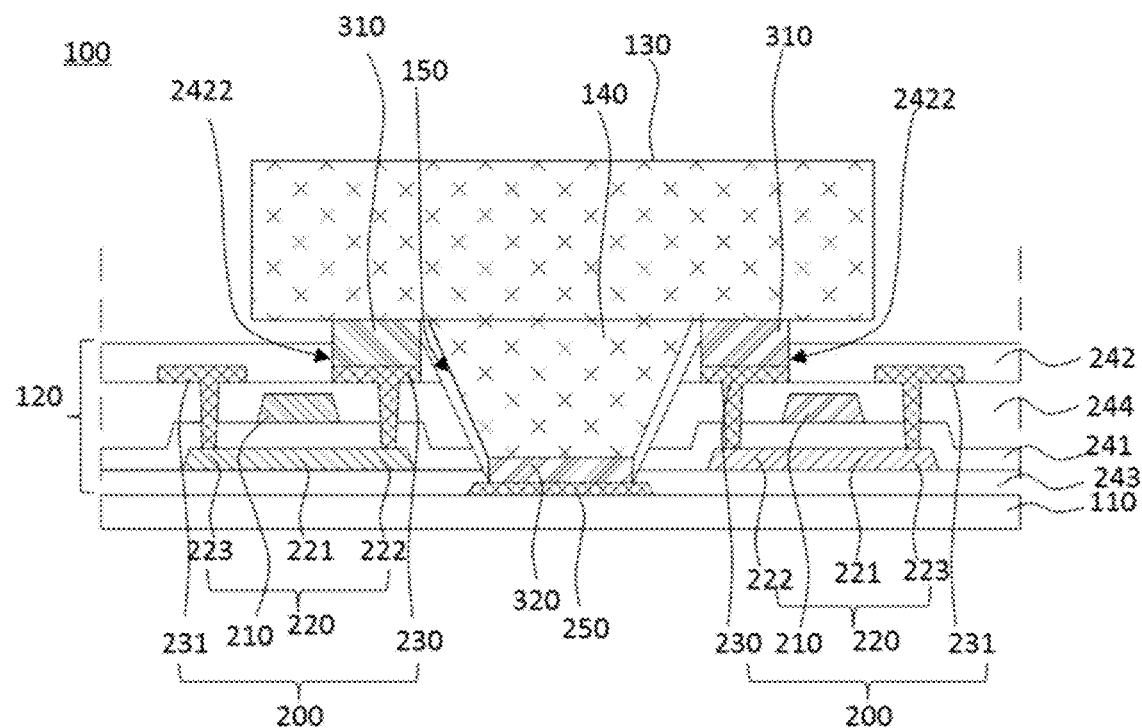
FIG. 9 illustrates a schematic cross-sectional view of another exemplary display panel consistent with disclosed embodiments of the present disclosure.

The above-disclosed embodiments may be described using a bottom-gate thin film transistor as an example. In any other embodiment of the present disclosure, the thin film transistor may also be a top-gate thin film transistor. FIG. 9 illustrates a schematic cross-sectional view of another display panel consistent with disclosed embodiments of the present disclosure, and the cross-section may be perpendicular to the plane where the display panel is located.

The difference between the present embodiment and the above-mentioned embodiments may include that the active layer 220, the gate electrode 210, and the first end 230 may be sequentially disposed along a direction facing away from the substrate 110. The first insulating layer 241, e.g., the gate-insulating layer, may be disposed between the gate electrode and the active layer. A fourth insulating layer 244, e.g., an interlayer insulating layer, may be disposed between the gate electrode and the first end. The same or similar features between the present embodiment and the above-mentioned embodiments may not be repeated herein.

Figure 8:
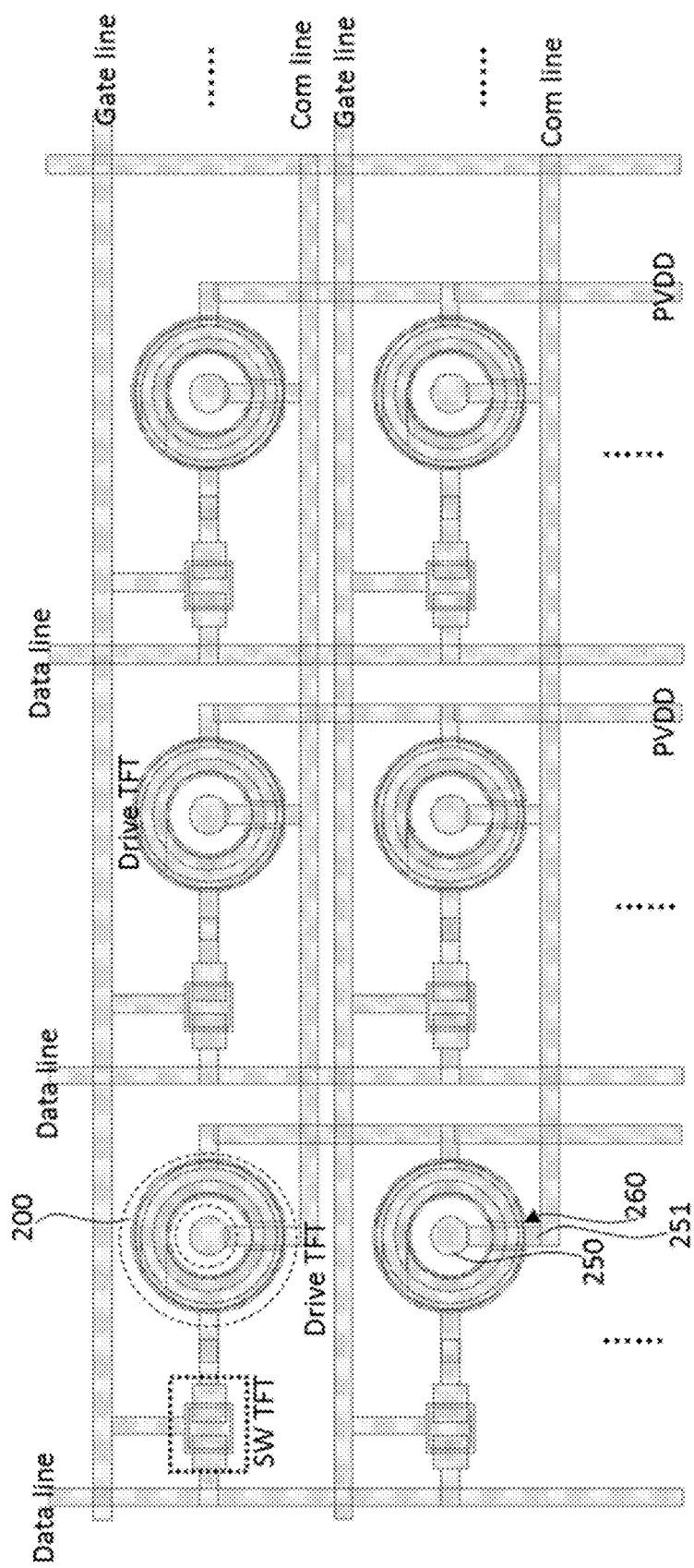
FIG. 8 illustrates a schematic top view of a structure of an array layer of an exemplary display panel consistent with disclosed embodiments of the present disclosure.

FIG. 8 illustrates a schematic top view of a structure of an array layer of a display panel consistent with disclosed embodiments of the present disclosure. Referring to FIG. 1 and FIGS. 4-8, the active layer 220 may further include a ring-shaped first contact region 222. Optionally, the first contact region 222 may form one of a source contact region and a drain contact region of the active layer 220. The source contact region and the drain contact region may be formed by doping N-type impurity ions or P-type impurity ions. The channel region 221 may be located between the source contact region and the drain contact region.

In one embodiment, the channel region 221 may surround the first contact region 222. The first end 230 may be overlapped and in contact with the first contact region 222. In other words, the channel region may have a ring-shape, and the active layer may further include the ring-shaped first contact region located inside the ring of the channel region. The first end may be overlapped and in contact with the first contact region.

Optionally, the thin film transistor 200 may further include a ring-shaped second end 231, and the second end 231 may be the other one of the source and drain electrodes. In other words, the second end 231 may be the one of the source and drain electrodes different from the first end 230. The second end 231 may surround the first end 230. Optionally, the second end 231 may be formed in a same layer and made of a same material as the first end 230.

The active layer 220 may further include a ring-shaped second contact region 223. The second contact region 223 may surround the channel region 221. The second contact region 223 may form the other one of the source contact region and the drain contact region of the active layer 220 different from the first contact region 222. In other words, the second contact region 223 may surround the channel region 221 and the first contact region 222. In other words, the first end may be connected to a side region of the active layer close to the inner ring. The second end 231 may be overlapped and in contact with the second contact region 223.

In the disclosed embodiments, the second contact region 223 may surround the channel region 221 and the first contact region 222. The first end 230 may be overlapped and in contact with the first contact region 222. Further, the first electrode of the light-emitting device may be correspondingly connected to the first end. Therefore, the first electrode of the light-emitting device may be connected to the inner ring of the thin film transistor. In view of this, the first electrode of the light-emitting device may be prevented from crossing the channel region of the active layer, which may avoid too many overlaps between the electrode of the light-emitting device and the channel region of the thin film transistor, and may avoid affecting the electrical performance of the device, e.g., generating a coupling. Further, the light-emitting device may be connected to the electrode (e.g., the first end 230) in the inner ring of the thin film transistor, which may facilitate the other end of the thin film transistor (e.g., the electrode in the outer ring in the Figure, the second end 231) to be connected to any other structure outside the thin film transistor, to avoid winding.

In addition, because the light-emitting device is an LED, and the LED emits light in multiple directions. In other words, the LED may emit light in various directions, and the electrical performance of the channel region of the active layer may be affected by the light. Therefore, in the disclosed embodiments, the light-emitting device may be prevented from being overlapped with the channel region of the active layer, while satisfying the overlap between the TFT and LED structures, improving the distribution density of in-plane LEDs, and improving the screen resolution, the light-emitting device may be prevented from affecting the electrical performance of the thin-film transistor, thereby improving the display performance of the display panel.

Figure 10:
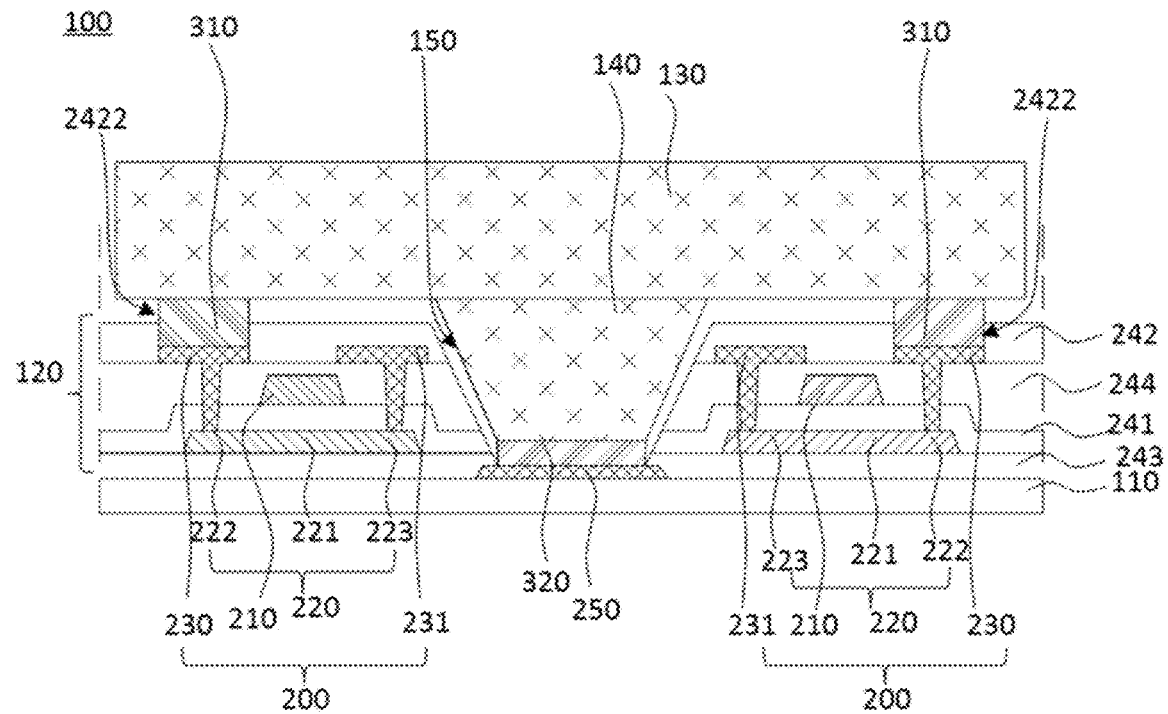
FIG. 10 illustrates a schematic cross-sectional view of another exemplary display panel consistent with disclosed embodiments of the present disclosure.
Figure 11:
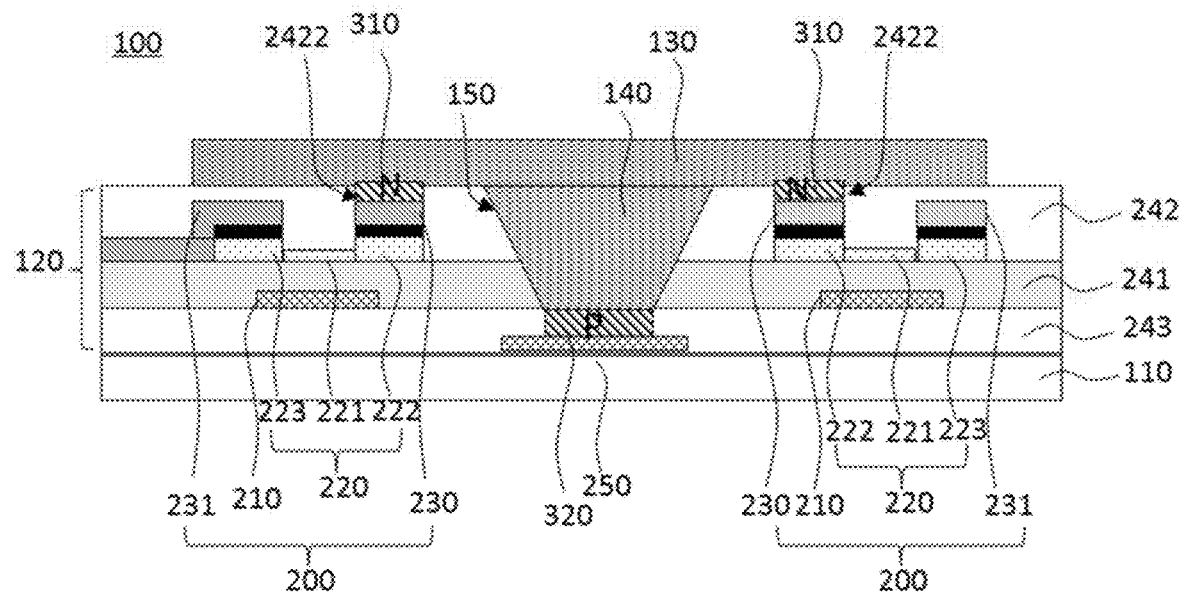
FIG. 11 illustrates a schematic cross-sectional view of another exemplary display panel consistent with disclosed embodiments of the present disclosure.

FIG. 10 illustrates a schematic cross-sectional view of another display panel consistent with disclosed embodiments of the present disclosure, and the cross-section may be perpendicular to a plane where the display panel is located. In another embodiment, referring to FIG. 10, the difference between the present embodiment and the above-disclosed embodiments may include following. The active layer 220 may further include a ring-shaped first contact region 222, and the first contact region 222 may surround the channel region 221. The first end 230 may be correspondingly overlapped and in contact with the first contact region 222. The thin film transistor 200 may further include a ring-shaped second end 231, and the second end 231 may be the other one of the source and drain electrodes. The active layer 220 may further include a ring-shaped second contact region 223, and the channel region 221 may surround the second contact region 223. The second end 231 may be correspondingly overlapped and in contact with the second contact region 223.

In one embodiment, the channel region 221 may be surrounded by the first contact region 222. The first end 230 may be overlapped and in contact with the first contact region 222. In other words, the channel region may have a ring-shape, and the active layer may further include a ring-shaped first contact region disposed on the outside of the ring of the ring-shaped channel region. The first end may be overlapped and in contact with the first contact region. In other words, the first end may be connected to the region of the active layer near the outer ring.

Optionally, the second end 231 may be one of the source and drain electrodes different from the first end 230. The second end 231 may be surrounded by the first end 230. The second end 231 may be formed in a same layer and made of a same material as the first end 230.

The active layer 220 may further include a ring-shaped second contact region 223. The second contact region 223 may be surrounded by the channel region 221. The second contact region 223 may form the other one of the source contact region and the drain contact region of the active layer 220 different from the first contact region 222. In other words, the second contact region 223 may be surrounded by the channel region 221 and the first contact region 222. In other words, the second end may be connected to the region of the active layer near the inner ring.

Further, on the basis of any one of the above-disclosed embodiments, and in combination with the drawings in any one of the above-disclosed embodiments, the light-emitting device 130 may further include a second electrode 320. The second electrode 320 and the first electrode 310 may be disposed on a same side of the light-emitting device 130, and the first electrode 310 may surround the second electrode 320.

In one embodiment, the light-emitting device 130 may include two ends that are opposite to each other. The first electrode 310 and the second electrode 320 may be located at a same end of the light-emitting device 130. Optionally, the light-emitting device 130 may include an end facing toward the substrate 110 and an end facing away from the substrate 110, and both the first electrode 310 and the second electrode 320 may be located at the end of the light-emitting device 130 facing toward the substrate 110.

The second electrode 320 may be the other one of the anode (or N-electrode, positive electrode) and the cathode (or P-electrode, negative electrode) of the light-emitting device 130 made of LED different from the first electrode 310. In one embodiment, for illustrative purposes, the second electrode 320 being a P-electrode may be used as an example.

Optionally, the second electrode 320 may be located in the center of the ring-shaped first electrode 310. The outer contour of the second electrode 320 may be consistent with the shape of the ring-shaped first electrode 310, while the size of the second electrode 320 may be smaller than the size of the ring-shaped first electrode 310, and, thus, the second electrode 320 may well fit the first electrode 310.

Further, the array layer 120 may further include a common electrode 250. The first end 230 may surround the common electrode 250. Optionally, the common electrode 250 may coincide with the ring center of the ring-shaped thin film transistor. The outer contour of the common electrode 250 may be consistent with the shape of the ring-shaped thin film transistor, while the size of the common electrode 250 may be smaller than the size of the ring-shaped thin film transistor, such that the common electrode may well fit the thin film transistor and the light-emitting device. Further, the common electrode 250 may be electrically connected to the second electrode 320.

In one embodiment, by nesting the ring-shaped first electrode and the second electrode, the alignments of the two electrodes may not disturb each other, such that the second electrode and the first electrode may be substantially accurately aligned with the first end and the common electrode, respectively.

Further, the light-emitting device 130 may include a protrusion 140 protruding toward the substrate 110, and the second electrode 320 may be located on the protrusion 140. It should be noted that the meaning of "on" in the present embodiment may be different. "The second electrode 320 may be located on the protrusion 140" described herein may mean that the second electrode 320 may be located on a side surface of the protrusion 140 facing away from the light-emitting device.

Optionally, the protrusion may be located at the ring center of the ring-shaped first electrode. For example, in the present embodiment, the ring center of the first electrode may coincide with the geometric center of the LED. In other words, the LED may have a cylindrical shape, and the first electrode may be located at an end of the pillar. A central axis of the pillar may coincide with the ring center of the first electrode, and the protrusion may be located on the central axis of the cylindrical LED.

The insulating layer in the array layer 120 may include a groove 150 exposing the common electrode 250. In one embodiment, all the insulating layers over the common electrode 250 may together form the groove 150. For example, the first insulating layer 241 and the second insulating layer 242 in FIG. 1 may together form the groove 150.

The protrusion 140 may fit the groove 150. In other words, the protrusion 140 may be embedded in the groove 150 to enable the common electrode 250 to be in contact with the second electrode 320, and, thus, the common electrode 250 may be electrically connected to the second electrode 320.

In the disclosed embodiments, both the second electrode and the first end may be configured in a ring having a consistent pattern. The position of the first electrode and the second electrode may be configured that the ring-shaped first electrode may surround the second electrode. The ring-shaped thin film transistor may surround the common electrode. The protrusion where the second electrode is located may fit the groove exposing the common electrode. The above features may cooperate with each other to achieve respectively accurate alignment of the first electrode and the second electrode. The first electrode may be aligned with the thin film transistor through a ring-to-ring manner, and the second electrode may be aligned with the common electrode through a manner of cooperation between the protrusion and groove. The different alignment methods of the two electrodes may prevent the second electrode from being aligned with the thin film transistor, and may prevent the first electrode from being aligned with the common electrode. Therefore, the second electrode and the first electrode may be substantially accurately aligned with the first end and the common electrode, respectively, and the alignments of the two electrodes may not disturb each other by nesting the ring-shaped first electrode and the second electrode.

In addition, because the protrusion is embedded in the groove, the light-emitting device may be substantially stably disposed on the array layer through the nested structure, thereby improving the structural stability of the display panel.

In addition, while disposing a large number of light-emitting devices on the array layer, because the groove is formed on the thin film transistor and the protrusion is formed on the light-emitting device, merely the light-emitting device whose protrusion correctly falls into the groove may be fixed on the array layer. Therefore, the automatic assembly of the light-emitting device may be achieved, the alignment disposure of the light-emitting device may be performed without grasping and alignment device, and the problem of alignment error caused by limited accuracy of the transfer device may not occur.

Further, in combination with the drawings in the above-disclosed embodiments, for example, referring to FIG. 1 and FIGS. 4-8, the array layer 200 may further include a common electrode line 251 disposed in the same layer as the common electrode 250. The common electrode 250 may be formed in a same layer and made of a same material as the gate electrode 210. In other words, the common electrode, the common electrode line, and the gate electrode may be formed in a same layer, made of a same material, and fabricated in a same manufacturing process.

The gate electrode 210 may be a non-closed ring having the first notch 260, and the common electrode line 251 may be electrically connected to the common electrode 250 through the first notch 260. Optionally, the common electrode line may be used for transmitting a cathode signal for the common electrode.

Optionally, the display panel may further include a signal source, e.g., a control chip IC, and the common electrode line may connect the common electrode and the control chip. The common electrode line may pass through the first notch to be connected to the common electrode.

In the disclosed embodiments, the common electrode and the gate electrode may be formed in a same layer. The thin film transistor and the light-emitting device may be overlapped to reduce the occupied space. At the same time, the normal operation of each component device may be achieved through the design of the first notch, which may also reduce the manufacturing process, reduce the number of film layers, reduce the cost, and simplify the process.

Figure 12:
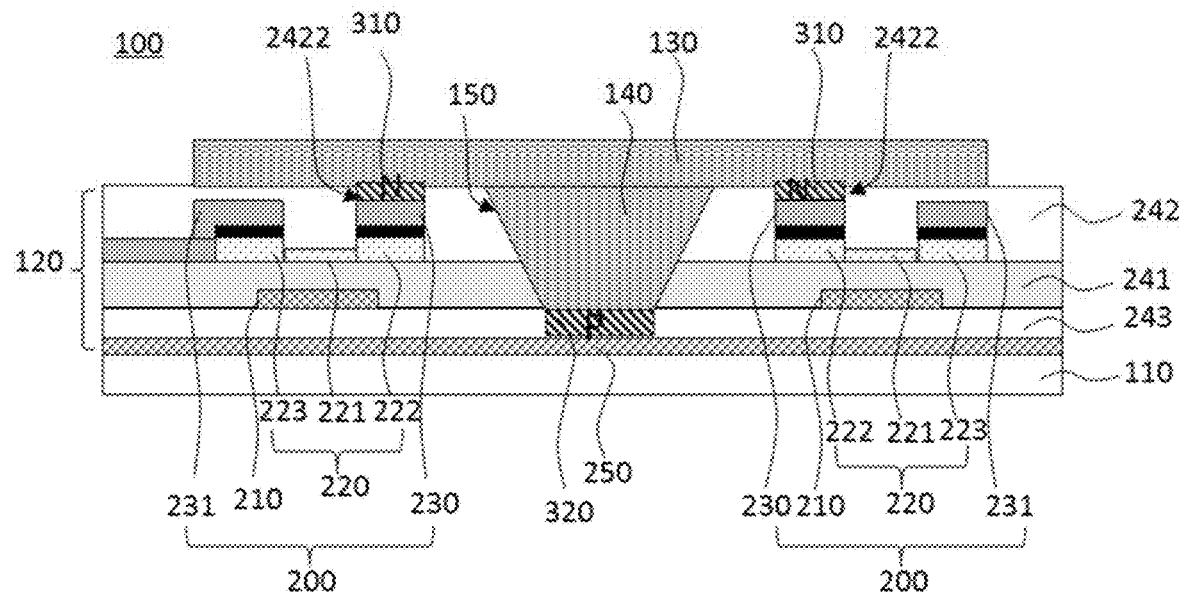
FIG. 12 illustrates a schematic cross-sectional view of another exemplary display panel consistent with disclosed embodiments of the present disclosure.
Figure 13:
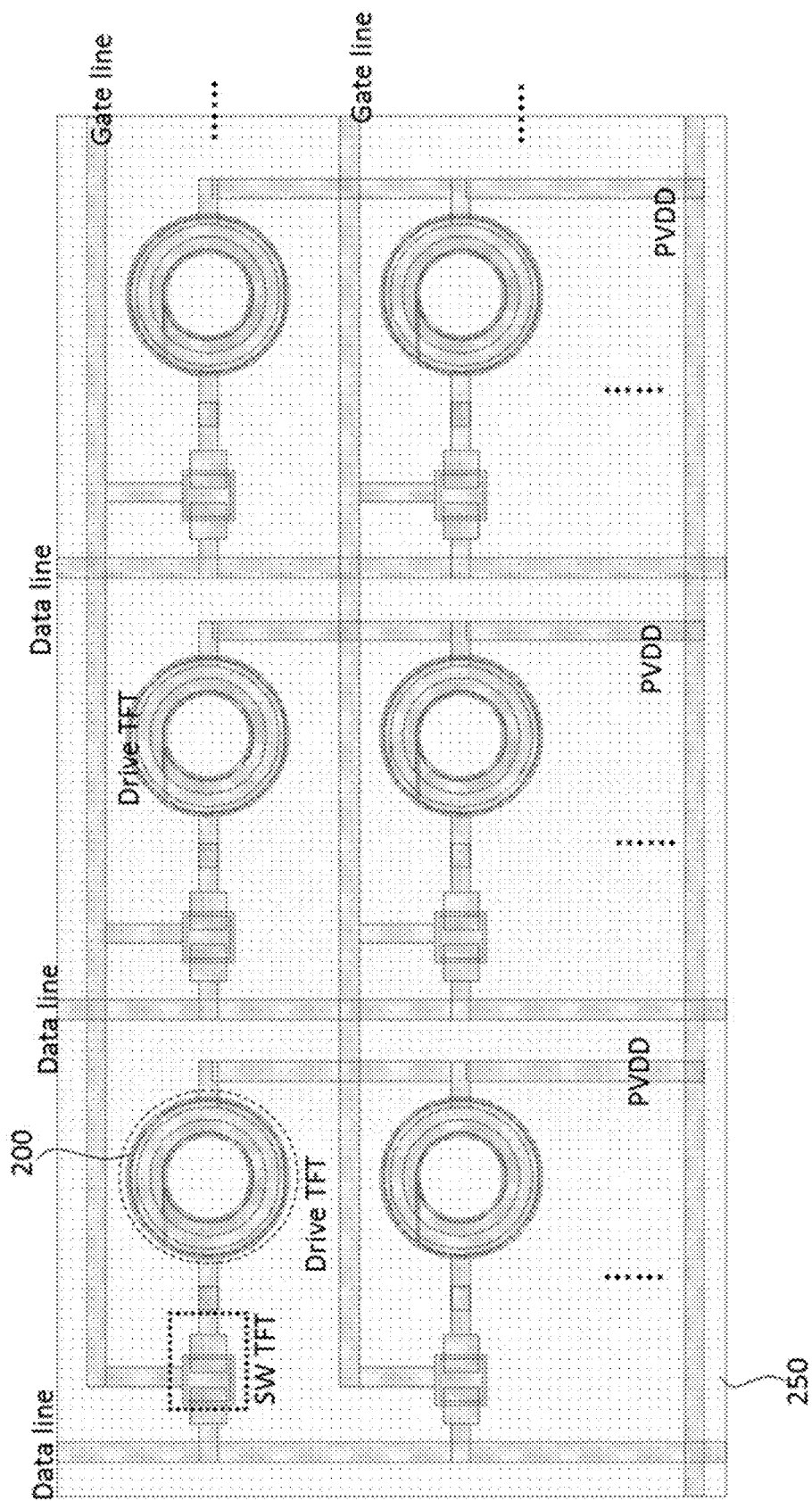
FIG. 13 illustrates a schematic top view of a structure of an array layer of another exemplary display panel consistent with disclosed embodiments of the present disclosure.

FIGS. 9-12 illustrate schematic cross-sectional views of other display panels consistent with disclosed embodiments of the present disclosure; and FIG. 13 illustrates a schematic top view of a structure of an array layer of another display panel consistent with disclosed embodiments of the present disclosure. In certain embodiments of the present disclosure, referring to FIGS. 9-13, the difference between the present embodiments and the above-disclosed embodiments may include that the common electrode 250 is disposed between the thin film transistor 200 and the substrate 110.

In one embodiment, a third insulating layer 243 may be disposed between the common electrode 250 and the thin film transistor 200. Optionally, the gate electrode 221 may have a closed-ring shape.

Further, referring to FIGS. 12-13, the common electrode 250 may have a one-piece structure fully covering the entire surface of the substrate. In other words, the projection of the common electrode 250 on the substrate 110 may cover at least two pixels.

Optionally, the common electrode may be a full planar electrode covering the entire display region. The common electrode 250 may be connected to a fixed position. The common electrode may be made of a material including a reflective material.

In the disclosed embodiments, while reducing the space occupied by the TFT and the light-emitting device and improving the resolution, the common electrode may be disposed between the thin film transistor and the substrate. The integrity of the ring-shaped thin film transistor may be ensured, and the gate electrode may have a closed ring shape, to enable the TFT to have consistent electrical performance in each region inside the ring. In addition, the common electrode fully covering the entire surface of the substrate may enable the structure of the display panel to be substantially stable, and may ensure uniformity of the surface. Moreover, because the common electrode can be multiplexed as an electrostatic shielding layer, which may have an electrostatic protection function. Further, the common electrode may also simultaneously serve as a light-reflecting layer. Furthermore, in the disclosed embodiments, the common electrode may be evaporated on the entire surface of the substrate without using a mask, which may simplify the process.

Figure 14:
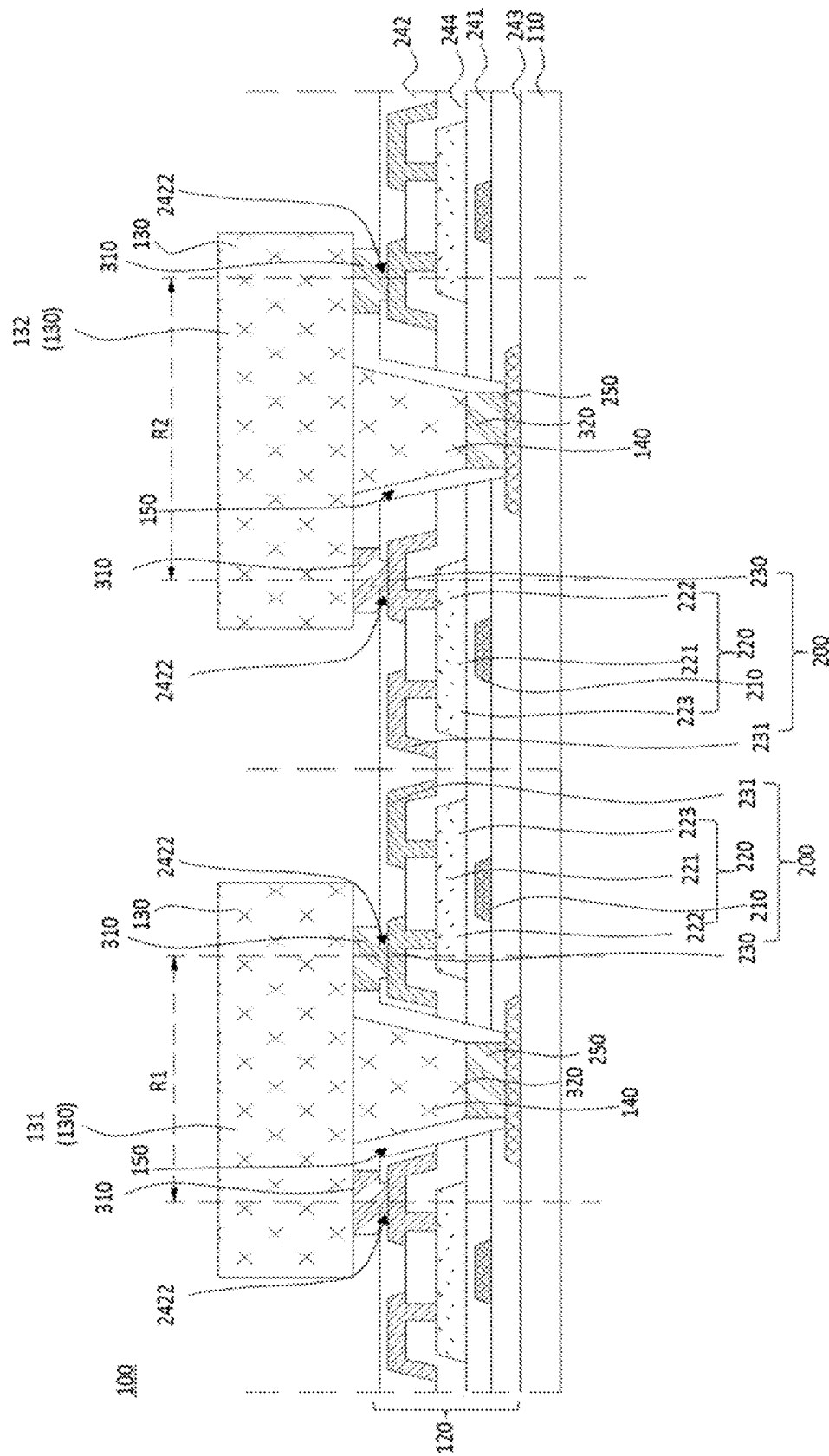
FIG. 14 illustrates a schematic cross-sectional view of another exemplary display panel consistent with disclosed embodiments of the present disclosure.

FIG. 14 illustrates a schematic cross-sectional view of another display panel consistent with disclosed embodiments of the present disclosure. Referring to FIG. 14, the display panel 100 may include a plurality of light-emitting devices 130. The plurality of light-emitting devices 130 may include at least two types of light-emitting devices of different colors. In other words, the plurality of light-emitting devices 130 may be classified into at least two types of light-emitting devices of different luminescent colors according to luminescent colors.

The diameters of the first electrodes 310 of the light-emitting devices 130 of different colors may be different, and the diameters of the first ends 230 of the thin-film transistors 200 corresponding to the light-emitting devices 130 of different colors may be different. The first electrode 310 of the light-emitting device 130 of a same color may have a same diameter as the first end 230 of the thin film transistor 200 corresponding to the light-emitting device 130 of the same color.

In one embodiment, the plurality of light-emitting devices 130 may at least include a light-emitting device 131 of a first color and a light-emitting device 132 of a second color, and the first color may be different from the second color. A diameter R1 of the first electrode 310 of the light-emitting device 131 of the first color may be smaller than a diameter R2 of the first electrode 310 of the light-emitting device 131 of the second color. The diameter R1 of the first end 230 of the thin film transistor 200 corresponding to the light-emitting device 131 of the first color may be smaller than the diameter R2 of the first end 230 of the thin film transistor 200 corresponding to the light-emitting device 132 of the second color.

It can be understood that the diameter of the first electrode of the light-emitting device of the first color may be the same as the diameter of the first end of the thin film transistor corresponding to the light-emitting device of the first color. The diameter of the first electrode of the light-emitting device of the second color may be the same as the diameter of the first end of the thin film transistor corresponding to the light-emitting device of the second color.

In the disclosed embodiments, a substantially reliable automatic assembly may be achieved. The light-emitting device of a different color may have a fixed corresponding thin-film transistor. After disposing a large number of light-emitting devices on the array layer, through the above design, the corresponding light-emitting device and the thin film transistor may be correctly matched. A large number of light-emitting devices may be simultaneously aligned without manual selection, thereby achieving self-assembly of the light-emitting devices.

Further, the plurality of light-emitting devices may at least include the light-emitting device 131 of the first color and the light-emitting device 132 of the second color, and the first color may be different from the second color. The diameter R1 of the first electrode 310 of the light-emitting device 131 of the first color may be smaller than the diameter R2 of the first electrode 310 of the light-emitting device 132 of the second color. The light-emitting device of the first color may have a longer service lifetime, higher light conversion efficiency, or higher recognition sensitivity of human eye than the light-emitting device of the second color.

A low light conversion efficiency may be understood as a low light conversion efficiency of the light-emitting layer, and the light-emitting layer may be an organic light-emitting layer in a LED light-emitting element.

In the disclosed embodiments, the performance of the light-emitting devices of different colors e.g., service lifetime, light conversion efficiency, and recognition sensitivity of human eye, may be different. The aspect ratio of the channel of the thin film transistor may be changed by changing the diameter of ring of the thin film transistor.

After changing the diameter of the ring of the thin film transistor, merely the light-emitting device that correspondingly changes the diameter of the ring-shaped first electrode may be connected. Therefore, while ensuring the technical effects described in the above embodiments, in the present embodiment, it may be ensured that the compensated light-emitting device corresponding to the thin-film transistor is the light-emitting device that needs to be compensated.

In addition, it should be noted that the ring-shaped thin film transistor in the disclosed embodiments may be a ring-shaped thin film transistor. In other words, the gate electrode, the active layer, and the source and drain electrodes all may have a ring-shape.

Optionally, the center angles of both the ring-shaped first electrode and the ring-shaped first end may be greater than 180°. In one embodiment, both the ring-shaped first electrode and the ring-shaped first end may be a closed-ring, which may prevent an alignment risk.

Figure 15:
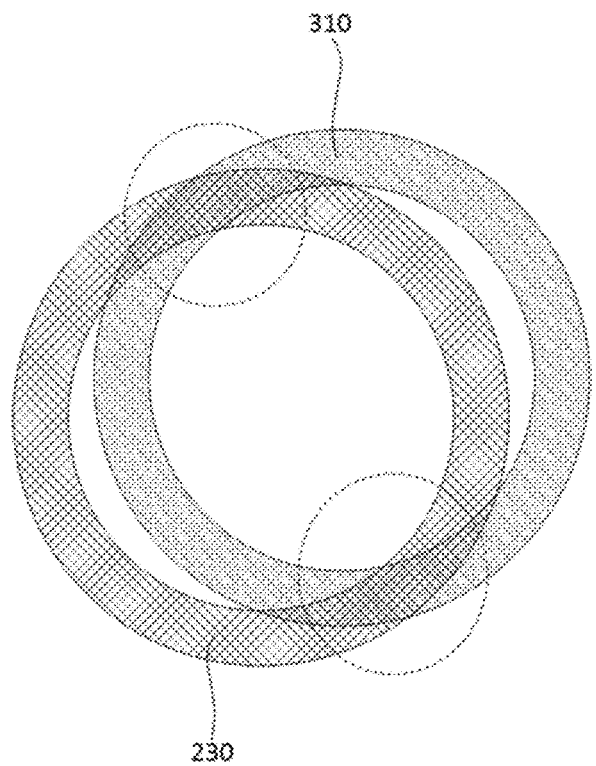
FIG. 15 illustrates a schematic local top view of another exemplary display panel in an alignment process consistent with disclosed embodiments of the present disclosure.

FIG. 15 illustrates a schematic local top view of another display panel in an alignment process consistent with disclosed embodiments of the present disclosure. Referring to FIG. 15, the thin film transistor 200 may be in combined with the light-emitting device 130. Because both the first electrode and the first end have ring-shaped conductive layers, even when accuracy of the alignment device is poor, the ring-shaped conductive layers are misaligned, in other words, the ring centers of the first electrode and the first end do not coincide, or the two rings are not fully overlapped with each other, it may at least be ensured that at least one point may be overlapped, as illustrated in the region surrounded by the dashed circle in FIG. 15. In view of this, an effective electrical connection between the thin film transistor 200 and the light-emitting device 130 may be ensured.

Optionally, the diameter of one of the ring-shaped first electrode and the ring-shaped first end may larger than an alignment error of the alignment device. Even if the alignment device has an alignment error, the error may be controlled to be in a range smaller than the diameter of one of the ring-shaped first electrode and the ring-shaped first end.

In certain embodiments of the present disclosure, the ring-shaped thin film transistor may be a triangular ring, a trapezoidal ring, a polygonal ring, or an irregular ring. Accordingly, the shape and size of the first electrode correspondingly connected to the thin film transistor may be consistent with the shape and size of the first end of the thin film transistor.

In certain embodiments of the present disclosure, as long as the overall shape of the first electrode 310 is consistent with the shape of the correspondingly connected first end of the thin film transistor, the shape and size of the first electrode correspondingly connected to the thin film transistor may be inconsistent with the shape and size of the first end of the thin film transistor.

Figure 16:
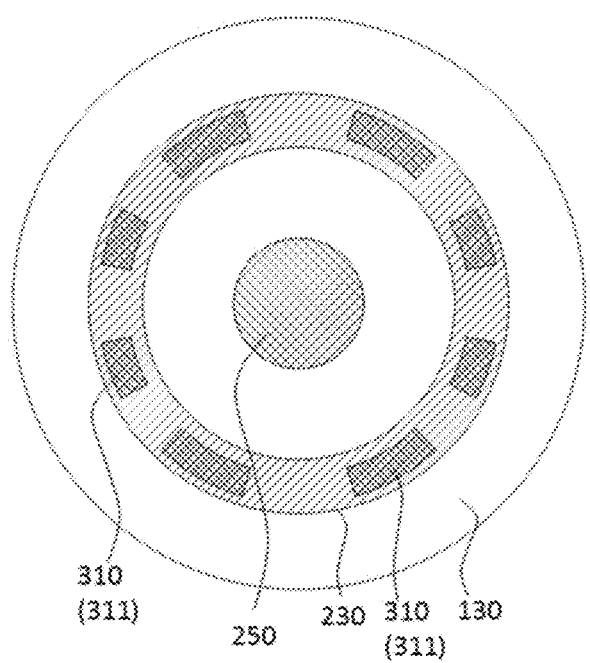
FIG. 16 illustrates a schematic local top view of another exemplary display panel consistent with disclosed embodiments of the present disclosure.

FIG. 16 illustrates a schematic local top view of another display panel consistent with disclosed embodiments of the present disclosure. Referring to FIG. 16, the first electrode 310 may be an electrode with overall ring shape formed by a plurality of sub-electrodes arranged along a ring shape. In other words, the sub-electrodes 311 may be arranged along the direction of the shape or the shape trend of the first end 230 (referring to the shape of the orthographic projection on the substrate 110).

In certain embodiments of the present disclosure, the first electrode 310 may be an integrally formed closed-ring electrode, or may be an integrally formed non-closed ring electrode.

Figure 17:
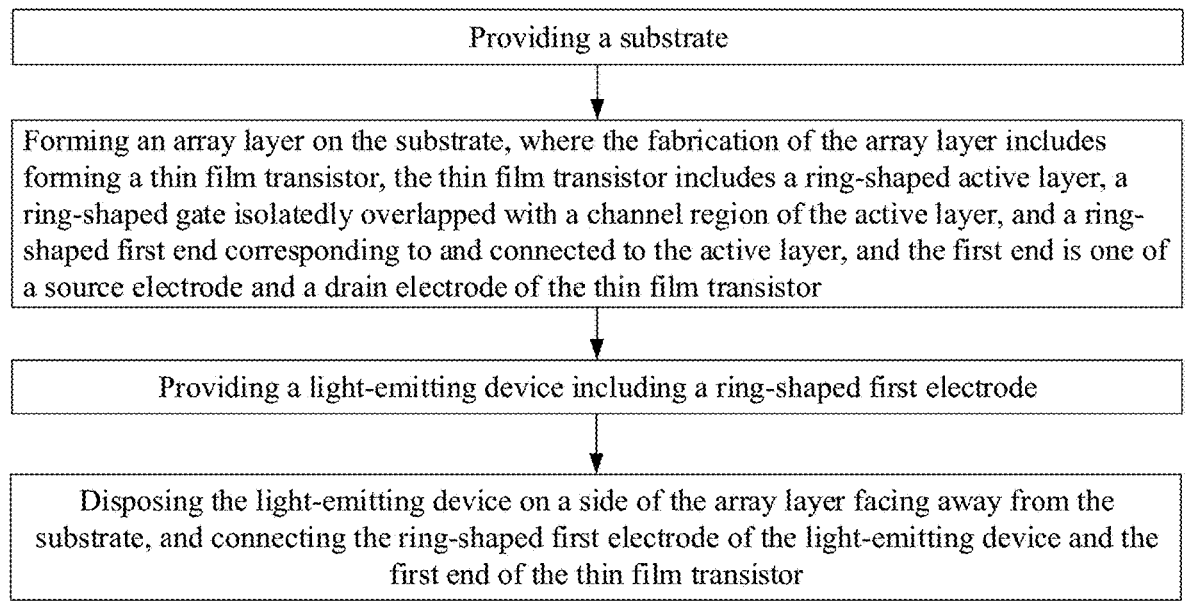
FIG. 17 illustrates a schematic flow chart of an exemplary fabrication method of a display panel consistent with disclosed embodiments of the present disclosure.

The present disclosure also provides a fabrication method of a display panel. FIG. 17 illustrates a schematic flow chart of a fabrication method of a display panel consistent with disclosed embodiments of the present disclosure. The method may be applied to form the display panel in any one of the above-disclosed embodiments. Referring to FIGS. 1-17, the method may include providing a substrate 110, and forming an array layer 120 on the substrate 110.

The fabrication of the array layer 120 may include forming a thin film transistor 200. The fabrication of the thin film transistor 200 may include forming a ring-shaped active layer 220, a ring-shaped gate electrode 210 isolatedly overlapped with a corresponding channel region 221 of the active layer 220, a ring-shaped first end 230 corresponding to and connected to the active layer 220. The first end 230 may be one of a source and a drain of the thin film transistor 200.

The method may also include providing a light-emitting device 130. The light-emitting device 130 may include a ring-shaped first electrode 310. The light-emitting device 130 may be disposed on a side of the array layer 120 facing away from the substrate 110. The ring-shaped first electrode 310 of the light-emitting device 130 may correspond and be connected to the first end 230 of the thin film transistor 200.

Further, the fabricating of the array layer 120 may include forming a common electrode 250, and the first end 230 may surround the common electrode 250. The light-emitting device 130 may further include a second electrode 320. The second electrode 320 and the first electrode 310 may be disposed on a same side of the light-emitting device 130, and the first electrode 310 may surround the second electrode 320. The disposure of the light-emitting device 130 on the side of the array layer 120 facing away from the substrate 110 may include electrically connecting the common electrode 250 and the second electrode 320.

Optionally, the light-emitting device 130 may further include a protrusion 140 protruding toward the substrate 110, and the second electrode 320 may be located on the protrusion 140.

The fabrication of the array layer 120 may further include forming a groove 150 exposing the common electrode 250 in the insulating layer in the array layer 120. The disposure of the light-emitting device 130 on the side of the array layer 120 facing away from the substrate 110 may further include distributing a plurality of light-emitting devices 130 on the array layer, and vibrating the array layer 120 to enable the protrusion 140 to be embedded into the groove 150.

Through the disclosed embodiments, a large number of light-emitting devices may be distributed on the array layer, and the array layer (or display panel in the fabrication process) may be appropriately vibrated at the same time. Because the groove 150 is formed on the array layer, merely the light-emitting device having the protrusion 140 correctly fallen into the groove 150 may be fixed, thereby achieving self-assembly of the light-emitting device.

Optionally, the fabrication of the array layer 120 may further include forming the common electrode 250 and a common electrode line 251 in a same manufacturing process as the gate electrode 210. The common electrode line 251 may be electrically connected to the common electrode 250 through a first notch 260.

Optionally, in certain embodiments of the present disclosure, the difference from the above-disclosed embodiments may include that after the common electrode is formed, an insulating layer may be formed on the common electrode. A closed-ring-shaped gate electrode may be formed on the insulating layer. The common electrode may have a one-piece structure fully covering the entire surface of the substrate.

Figure 18:
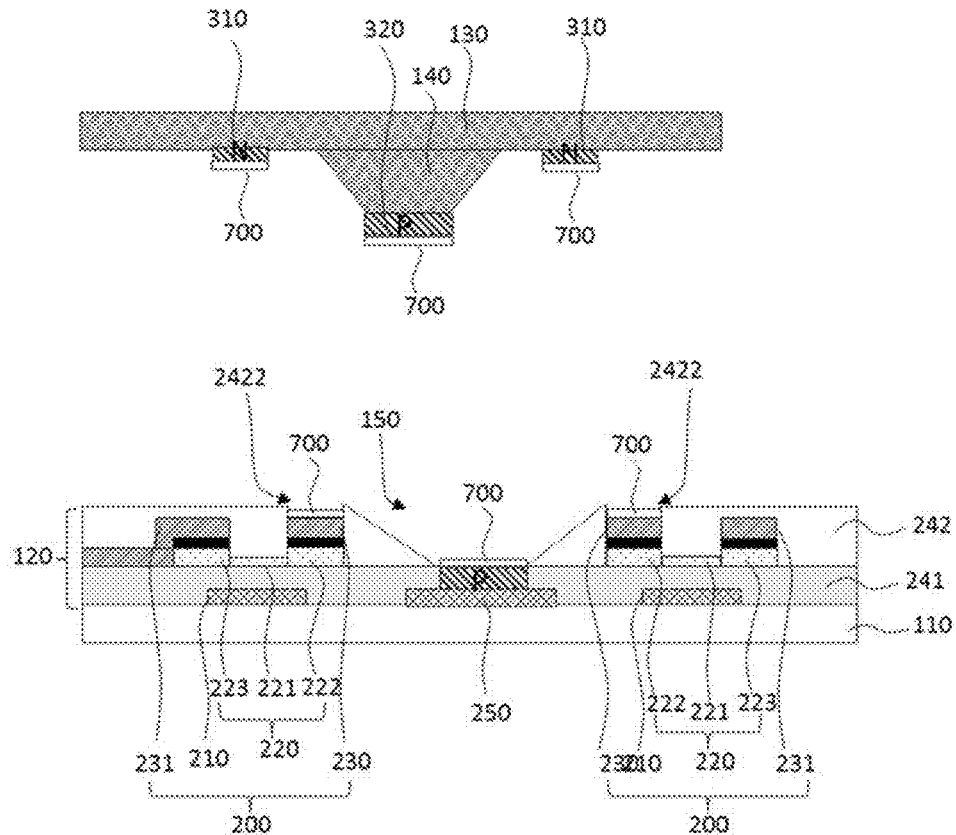
FIG. 18 illustrates a schematic diagram of another exemplary fabrication method of a display panel consistent with disclosed embodiments of the present disclosure.
Figure 19:
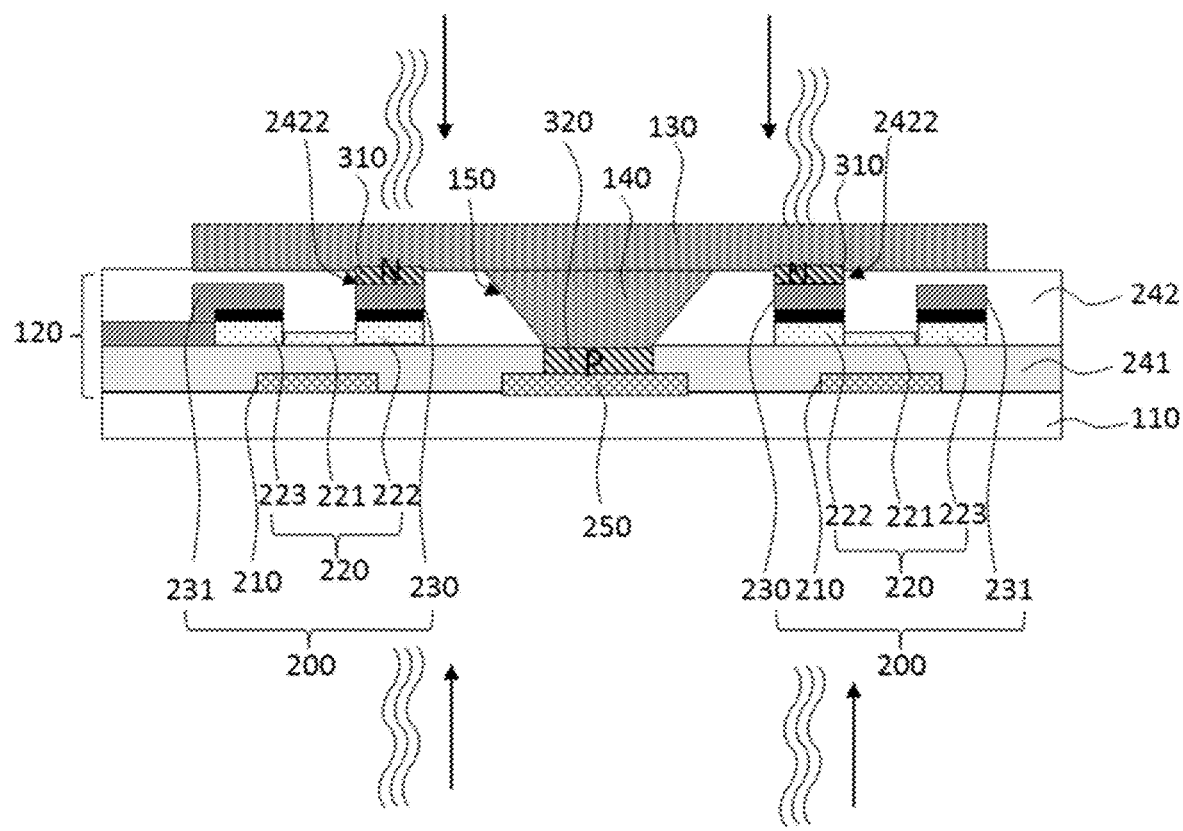
FIG. 19 illustrates a schematic diagram of another exemplary fabrication method of a display panel consistent with disclosed embodiments of the present disclosure.

FIG. 18 illustrates a schematic diagram of another fabrication method of a display panel consistent with disclosed embodiments of the present disclosure; and FIG. 19 illustrates a schematic diagram of another fabrication method of a display panel consistent with disclosed embodiments of the present disclosure. Referring to FIG. 18, the disposure of the light-emitting device 130 on the side of the array layer 120 facing away from the substrate 110 may further include attaching solder 700 to the first electrode 310 or the first end 230.

Optionally, the melting point of the solder 700 may be lower than 200° C. In view of this, the first electrode 310 may be ensured to be stably connected to the first end 230 through the solder. Further, when subsequently thermally melting the solder to connect the first electrode 310 and the first end 230, the heating temperature required for the solder may be prevented from being substantially high, which may cause either insufficient melting connection, or may cause the devices in the display panel, e.g., the thin film transistor and the light-emitting device, to be damaged at a high temperature.

Referring to FIG. 19, the first electrode 310 may be aligned and be in contact with the first end 230. Then, hot wind having a direction perpendicular to the substrate 110 may be applied to at least the region required to be soldered. In other words, the hot wind may be applied from the outside at least at a position overlapped with the region where the first electrode 310 is in contact with the first end 230, and the wind may have a direction perpendicular to contact surface between the first electrode 310 and the first end 230. In view of this, the solder 700 may be melted to connect the first electrode 310 and the first end 230. Further, the welding pressure may increase by the force exerted by the wind to ensure that the relative position of the first electrode 310 and the first end 230 may be maintained without displacement during the welding process. Further, the adhesion between the first electrode 310 and the first end 230 may be improved by the welding pressure, and the fabrication accuracy may be improved.

In FIG. 19, the arrow may indicate the wind direction, and the wavy lines may indicate the hot wind. Optionally, the wind force of the hot wind may be equal to or less than 1000 mN. Therefore, while proving the effective wind pressure, the light-emitting device may be ensured to be prevented from being blown away, or the light-emitting device may be ensured to be prevented from being out of correct position.

Optionally, the temperature of the hot wind, i.e., the wind temperature, may be equal to or less than 230° C. The wind temperature may be greater than room temperature. In one embodiment, the wind temperature may be greater than 100° C. Ultimately, the display panel in the fabrication process may be cooled down to finish the welding, to form the display panel illustrated in FIG. 1.

In the disclosed fabrication method of the display panel, the fabrication accuracy may be improved. Through hot wind welding, operations that are harmful to the components of the display panel during the fabrication process may be reduced. In other words, the welding may be achieved, and structural stability during the welding process may be guaranteed. Further, the cost may be low, and the materials required for welding may be easily available.

Figure 20:
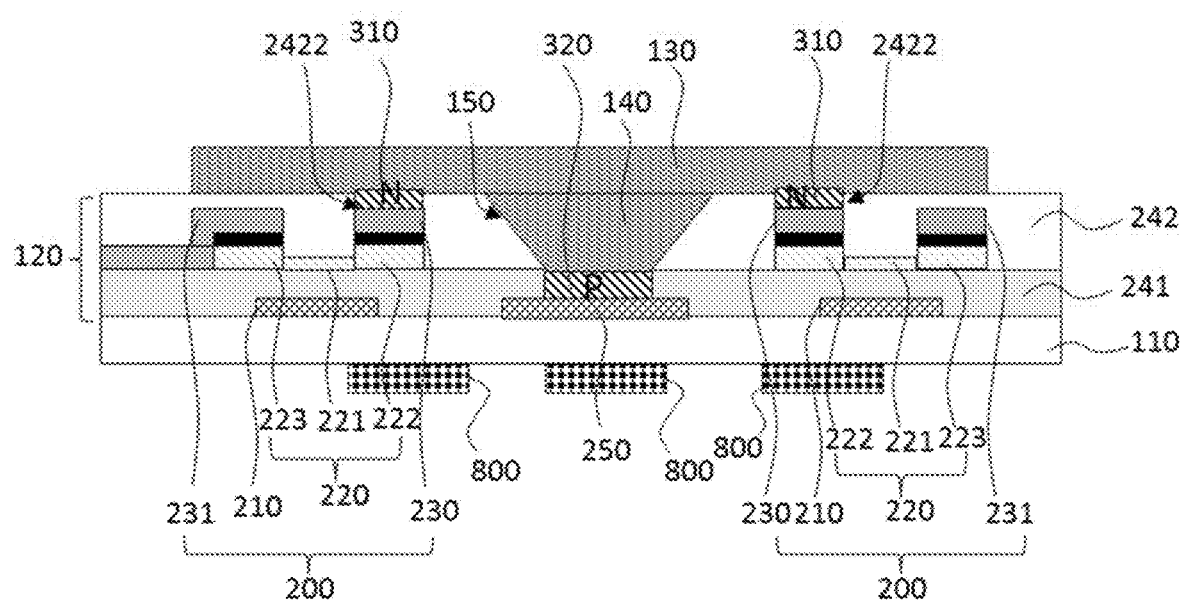
FIG. 20 illustrates a schematic diagram of another exemplary fabrication method of a display panel consistent with disclosed embodiments of the present disclosure.

FIG. 20 illustrates a schematic diagram of another fabrication method of a display panel consistent with disclosed embodiments of the present disclosure. Referring to FIG. 1, FIG. 18 and FIG. 20, the disposure of the light-emitting device 130 on the side of the array layer 120 facing away from the substrate 110 may further include following.

Referring to FIG. 18, solder 700 may be attached to the first electrode 310 or the first end 230. Optionally, the melting point of the solder 700 may be lower than 200° C. In view of this, the first electrode 310 may be ensured to be stably connected to the first end 230 through the solder. Further, when subsequently thermally melting the solder to connect the first electrode 310 and the first end 230, the heating temperature required for the solder may be prevented from being substantially high, which may cause either insufficient melting connection, or may cause the devices in the display panel, e.g., the thin film transistor and the light-emitting device, to be damaged at a high temperature.

Referring to FIG. 20, the first electrode 310 may be aligned and in contact with the first end 230. A magnetic material 800 may be placed on a side of the substrate 110 facing away from the array layer, and the light-emitting device 130 may be attracted and fixed by magnetic force of the magnetic material 800. Then, the solder may be heated. Optionally, the solder may be heated in an oven. Ultimately, the display panel in the fabrication process may be cooled down to finish the welding, to form the display panel illustrated in FIG. 1. Optionally, the magnetic material 800 may be removed after the cooling is finished.

In the fabrication method of the display panel in disclosed embodiments, the fabrication accuracy may be improved. The light-emitting device 130 may be attracted and fixed by the magnetic force of the magnetic material 800, which may reduce operations that cause damages to the display panel during the fabrication process. In other words, the welding may be achieved, and structural stability during the welding process may be guaranteed. In addition, the cost may be low, and the magnetic material required for welding may be easily available. Further, the welding force applied by the magnetic material 800 may have desired direction control, which may make the fabrication process substantially stable and reliable.

Optionally, the first electrode may be aligned and in contact with the first end, and the corresponding process may include following. A large number of light-emitting devices may be distributed on the array layer, and the array layer (or display panel in the fabrication process) may be appropriately vibrated at the same time. Because the groove 150 is formed on the array layer, merely the light-emitting device having the protrusion 140 correctly fallen into the groove 150 may be fixed, thereby achieving self-assembly of the light-emitting device.

Figure 21:
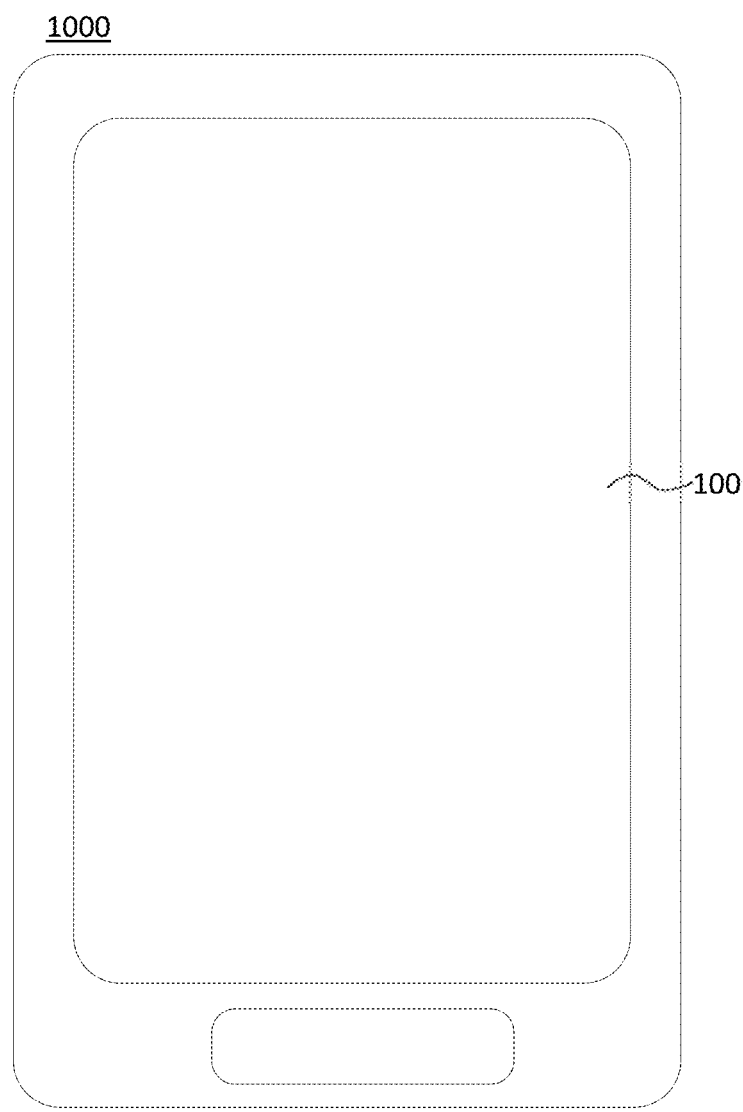
FIG. 21 illustrates a schematic structural diagram of an exemplary display device consistent with disclosed embodiments of the present disclosure.

The present disclosure also provides a display device, including any one of display panels provided by the present disclosure. FIG. 21 illustrates a schematic structural diagram of a display device consistent with disclosed embodiments of the present disclosure. Referring to FIG. 21, the display device 1000 may include a display panel 100 provided by any one of disclosed embodiments of the present disclosure. For illustrative purposes, the embodiment illustrated in FIG. 21 may use a mobile phone as an example to describe the display device 1000. It can be understood that the display device provided by the disclosed embodiments of the present disclosure may be a computer, a television, a car display device, or any other display device with a display function, which is not limited by the present disclosure. The display device provided by the disclosed embodiments of the present disclosure may have the beneficial effects of the display panel provided by the disclosed embodiments of the present disclosure, and details may refer to the specific description of the display panel in the foregoing embodiments, which is not repeated herein.

In the disclosed embodiments of the present disclosure, the light-emitting device may be overlapped with the thin film transistor, which may reduce the space occupied by a pixel composed of correspondingly connected light-emitting device and thin film transistor. A substantially large amount of pixels may be disposed on the display panel having a same area, thereby improving the screen resolution.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a substrate;
an array layer disposed on the substrate; and
a light-emitting device disposed on a side of the array layer facing away from the substrate, wherein:
the array layer includes a thin film transistor, wherein:
the thin film transistor includes a ring-shaped active layer, a ring-shaped gate electrode isolatedly overlapped with a channel region of the ring-shaped active layer, and a ring-shaped first end corresponding to and connected to the ring-shaped active layer, and
the ring-shaped first end is one of a source electrode and a drain electrode of the thin film transistor, and
the light-emitting device includes a first electrode, wherein the first electrode is connected to the ring-shaped first end, and the first electrode is a ring-shaped electrode.

2. The display panel according to claim 1, wherein:
the ring-shaped active layer further includes a ring-shaped first contact region,
the channel region surrounds the ring-shaped first contact region, and
the ring-shaped first end is overlapped and in contact with the ring-shaped first contact region;
the thin film transistor further includes a ring-shaped second end, and the ring-shaped second end is another one of the source electrode and the drain electrode of the thin film transistor; and
the ring-shaped active layer further includes a ring-shaped second contact region, wherein the ring-shaped second contact region surrounds the channel region, and the ring-shaped second end is overlapped and in contact with the ring-shaped second contact region.

3. The display panel according to claim 1, wherein:
the ring-shaped active layer further includes a ring-shaped first contact region,
the ring-shaped first contact region surrounds the channel region, and
the ring-shaped first end is overlapped and in contact with the ring-shaped first contact region;
the thin film transistor further includes a ring-shaped second end, and the ring-shaped second end is another one of the source electrode and the drain electrode of the thin film transistor; and the ring-shaped active layer further includes a ring-shaped second contact region, wherein the channel region surrounds the ring-shaped second contact region, and the ring-shaped second end is overlapped and in contact with the ring-shaped second contact region.

4. The display panel according to claim 1, wherein:
the light-emitting device further includes a second electrode, wherein the second electrode and the first electrode are disposed on a same side of the light-emitting device, and the first electrode surrounds the second electrode.

5. The display panel according to claim 4, wherein:
the array layer further includes a common electrode, wherein:
the ring-shaped first end surrounds the common electrode, and
the common electrode is electrically connected to the second electrode.

6. The display panel according to claim 5, wherein:
the array layer further includes a common electrode line disposed in a same layer as the common electrode,
the common electrode is formed in a same layer and made of a same material as the ring-shaped gate electrode, and
the ring-shaped gate electrode has a non-closed ring shape including a first notch, and the common electrode line is electrically connected to the common electrode through the first notch.

7. The display panel according to claim 5, wherein:
the common electrode is disposed between the thin film transistor and the substrate along a direction perpendicular to a surface of the substrate, and
the common electrode fully covers an entire surface of the substrate, and the ring-shaped gate electrode has a closed-ring shape.

8. The display panel according to claim 5, wherein:
the light-emitting device further includes a protrusion protruding toward the substrate, and the second electrode is disposed on the protrusion;
an insulating layer in the array layer includes a groove exposing the common electrode; and
the protrusion is embedded in the groove.

9. The display panel according to claim 1, wherein:
the display panel includes a plurality of light-emitting devices, and the plurality of light-emitting devices include at least two types of light-emitting devices of different colors, wherein:
a diameter of a first electrode of a light-emitting device of a different color is different, and a diameter of a first end of a thin-film transistor corresponding to the light-emitting device of the different color is different, and
a diameter of a first electrode of a light-emitting device of a same color is the same as a diameter of a first end of a thin film transistor corresponding to the light-emitting device of such color.

10. The display panel according to claim 9, wherein:
the plurality of light-emitting devices at least include a first light-emitting device of a first color and a second light-emitting device of a second color, and the first color is different from the second color, wherein;
a diameter of a first electrode of the first light-emitting device of the first color is smaller than a diameter of a first electrode of the second light-emitting device of the second color, and
the first light-emitting device of the first color and the second light-emitting device of the second color are different in at least one of service lifetime, light conversion efficiency, and human-eye recognition sensitivity.

11. The display panel according to claim 10, wherein:
the first light-emitting device of the first color has a longer service lifetime, a higher light conversion efficiency, or higher human-eye recognition sensitivity than the second light-emitting device of the second color.

12. The display panel according to claim 1, wherein:
the first electrode is one of a one-piece closed-ring-shaped electrode, a one-piece non-closed-ring-shaped electrode, and an electrode having an overall ring shape formed by a plurality of sub-electrodes arranged along a ring shape.

13. A fabrication method of a display panel, comprising:
providing a substrate;
forming an array layer on the substrate, wherein the fabrication of the array layer includes forming a thin film transistor, the thin film transistor comprising:
a ring-shaped active layer, a ring-shaped gate electrode isolatedly overlapped with a channel region of ring-shaped the active layer, and a ring-shaped first end corresponding to and connected to the ring-shaped active layer, wherein the ring-shaped first end is one of a source electrode and a drain electrode of the thin film transistor, providing a light-emitting device including a ring-shaped first electrode; and
disposing the light-emitting device on a side of the array layer facing away from the substrate, and connecting the ring-shaped first electrode of the light-emitting device and the ring-shaped first end of the thin film transistor.

14. The method according to claim 13, wherein:
the fabrication of the array layer further includes forming a common electrode, wherein the ring-shaped first end surrounds the common electrode;
the light-emitting device further includes a second electrode, wherein the second electrode and the ring-shaped first electrode are disposed on a same side of the light-emitting device, and the ring-shaped first electrode surrounds the second electrode; and
disposing the light-emitting device on the side of the array layer facing away from the substrate includes electrically connecting the common electrode and the second electrode.

15. The method according to claim 14, wherein:
the light-emitting device further includes a protrusion protruding toward the substrate, and the second electrode is disposed on the protrusion;
the fabrication of the array layer further includes forming a groove exposing the common electrode in an insulating layer in the array layer; and
disposing the light-emitting device on the side of the array layer facing away from the substrate further includes distributing a plurality of light-emitting devices on the array layer, and vibrating the array layer to enable the protrusion to be embedded in the groove.

16. The method according to claim 14, wherein:
the fabrication of the array layer further includes forming the common electrode and a common electrode line in a same manufacturing process of the ring-shaped gate electrode, and
the ring-shaped gate electrode has a non-closed ring shape including a first notch, and the common electrode line is electrically connected to the common electrode through the first notch.

17. The method according to claim 14, wherein:
after forming the common electrode, an insulating layer is formed over the common electrode, and
a closed-ring-shaped gate electrode is formed over the insulating layer, wherein the common electrode has a one-piece structure fully covering an entire surface of the substrate.

18. The method according to claim 13, wherein disposing the light-emitting device on the side of the array layer facing away from the substrate further includes:
attaching solder to one or more of the ring-shaped first electrode and the ring-shaped first end,
aligning and contacting the ring-shaped first electrode with the ring-shaped first end,
applying hot air with a wind direction perpendicular to the substrate to a region to be welded, and
cooling down to finish welding.

19. The method according to claim 13, wherein disposing the light-emitting device on the side of the array layer facing away from the substrate further includes:
attaching solder to one or more of the ring-shaped first electrode and the ring-shaped first end,
aligning and contacting the ring-shaped first electrode with the ring-shaped first end,
placing a magnetic material on a side of the substrate facing away from the array layer to attract and fix the light-emitting device through magnetic attraction, and heating the solder, and
cooling down to finish welding.

20. A display device, comprising:
a display panel, wherein the display panel includes:
a substrate;
an array layer disposed on the substrate; and
a light-emitting device disposed on a side of the array layer facing away from the substrate, wherein:
the array layer includes a thin film transistor, wherein:
the thin film transistor includes a ring-shaped active layer, a ring-shaped gate electrode isolatedly overlapped with a channel region of the ring-shaped active layer, and a ring-shaped first end corresponding to and connected to the ring-shaped active layer, and
the ring-shaped first end is one of a source electrode and a drain electrode of the thin film transistor, and
the light-emitting device includes a first electrode, wherein the first electrode is connected to the ring-shaped first end, and the first electrode is a ring-shaped electrode.

* * * * *